United States Patent
Muthiah et al.

(10) Patent No.: US 10,372,603 B2
(45) Date of Patent: Aug. 6, 2019

(54) HANDLING OF UNALIGNED WRITES

(71) Applicant: Western Digital Technologies, Inc., San Jose, CA (US)

(72) Inventors: Ramanathan Muthiah, Bangalore (IN); Ramkumar Ramamurthy, Bangalore (IN); Balaji Thraksha Venkataramanan, Bangalore (IN)

(73) Assignee: Western Digital Technologies, Inc., San Jose, CA (US)

( * ) Notice: Subject to any disclaimer, the term of this patent is extended or adjusted under 35 U.S.C. 154(b) by 95 days.

(21) Appl. No.: 15/822,881

(22) Filed: Nov. 27, 2017

(65) Prior Publication Data
US 2019/0163620 A1    May 30, 2019

(51) Int. Cl.
*G06F 12/02* (2006.01)
*G06F 3/06* (2006.01)
*G06F 9/30* (2018.01)
*G11C 16/10* (2006.01)

(52) U.S. Cl.
CPC .......... *G06F 12/0246* (2013.01); *G06F 3/061* (2013.01); *G06F 3/064* (2013.01); *G06F 3/0659* (2013.01); *G06F 3/0688* (2013.01); *G06F 9/3013* (2013.01); *G11C 16/10* (2013.01)

(58) Field of Classification Search
None
See application file for complete search history.

(56) References Cited

U.S. PATENT DOCUMENTS

| | | | |
|---|---|---|---|
| 7,212,440 B2 | 5/2007 | Gorobets | |
| 7,395,404 B2 | 7/2008 | Gorobets et al. | |
| 7,769,978 B2 | 8/2010 | Gorobets et al. | |
| 8,924,631 B2 | 12/2014 | Ng et al. | |
| 9,170,942 B1* | 10/2015 | Derbeko | G06F 12/0802 |
| 9,582,435 B2 | 2/2017 | Jain et al. | |
| 9,703,491 B2 | 7/2017 | Mathur et al. | |
| 2011/0047347 A1 | 2/2011 | Li et al. | |
| 2016/0283110 A1* | 9/2016 | Jain | G06F 13/00 |
| 2016/0350250 A1* | 12/2016 | Vasudevan | G06F 13/4282 |

OTHER PUBLICATIONS

SD Association, Application Performance Class: The new class of performance for applications on SD memory cards (SD 5.1), White Papers, Nov. 2016, 8 pages.
SD Association, "SD Association Introduces App Performance Class and New SD Memory Card Symbol," Nov. 2016, 2 pages.

* cited by examiner

*Primary Examiner* — Michael Alsip
(74) *Attorney, Agent, or Firm* — Vierra Magen Marcus LLP

(57) ABSTRACT

One or more control circuits of a storage system are configured to consolidate the sensing of pre-pad and/or post-pad data for one unaligned write command with the transferring of previously sensed pre-pad and/or post-pad data for another unaligned write command. By consolidating the sensing and transferring, considerable time is saved when programming data for a set of two or more unaligned write commands. Also, in one aspect, a single programming operation is performed for multiple unaligned write commands. Some conventional solutions may need to perform a programming operation for each unaligned write command. Hence, considerable programming time is saved by the storage system. Moreover, write amplification may be reduced by the storage system.

20 Claims, 12 Drawing Sheets

HANDLING OF UNALIGNED WRITES

BACKGROUND

When a host device writes data to and reads data from a storage device, the host writes and reads data in terms of logical block addresses (LBAs). The basic unit of data transfer between the host and storage device is referred to herein as a "sector." By "basic unit" it is meant that this is the minimum size of data transfer for a read or write command. A request to read or write is thus a request to read or write some integer number of sectors. The size of a sector may vary from one implementation to the next, but one example of a sector size is 512 bytes. Note that the term "sector" as used herein does not refer to a physical sector on a hard disk drive, or the like. Also note that each LBA corresponds to a sector.

The storage device typically has a memory controller, which translates the LBAs to physical addresses of memory cells on the storage device. As one example, a flash memory device has a Flash Transfer Layer (FTL) or Media Management Layer (MML) that performs a logical address to physical address translation.

Prior to writing data to the memory cells, the memory controller typically forms a codeword from the data from the host. The codeword includes the host data and one or more parity bits. The number of parity bits may vary, depending on the strength of the error correction. The codeword is referred to herein as an "ECC page." An ECC page is formed from one or more sectors of host data. As one example, an ECC page may be formed from four sectors of host data. Thus, if sector size is 512 Bytes, an ECC page might contain 2K bytes of host data, plus parity bits. An ECC page is a unit of programming in the storage device.

The memory controller has a minimum addressable unit, which is typically one or more ECC pages. Thus, the minimum addressable unit corresponds to some number of sectors. Herein, the term "fragment" is used herein to refer to the minimal addressable unit of memory in the storage device. As one example, if the minimum addressable unit is two ECC pages, then the minimum addressable unit is 4 kB (assuming 512 Byte sector and four sectors per ECC page).

Herein, an aligned write is defined as one in which the start LBA and data size is a multiple of the number of sectors in the fragment. For example, if there are eight sectors in a fragment, then an aligned write has a start LBA that is a multiple of eight and data size that is a integer multiple of eight sectors.

Herein, a write that is not an aligned write is referred to as an unaligned write. Thus, an unaligned write either: 1) has a start LBA that is not a multiple of the number of sectors in the fragment; or 2) has a data size that is not a multiple of the number of sectors in the fragment.

When a host sends an aligned write command, the data can simply be written to the memory die as one or more fragments. However, when a host sends an unaligned write command, the memory controller needs to pre-pad and/or post-pad data the host data to form "aligned data." By aligned data it is meant that a complete fragment is formed. The memory controller may need to read the pre-pad and/or post-pad data from memory cells. Thus, the memory controller may need to perform a read-modify-write. A read-modify-write refers to reading in pre-pad and/or post-pad data from memory cells on the memory die, forming a fragment of aligned data, and writing the fragment of aligned data to the memory die.

Performing read-modify-writes can be quite time consuming. Moreover, performing read-modify-writes can increase write amplification. Write amplification means that the amount of data actually written to the storage device is more than the amount of host data to be written. Write amplification can reduce the lifespan of the storage device.

DETAILED DESCRIPTION

Figure 1A:
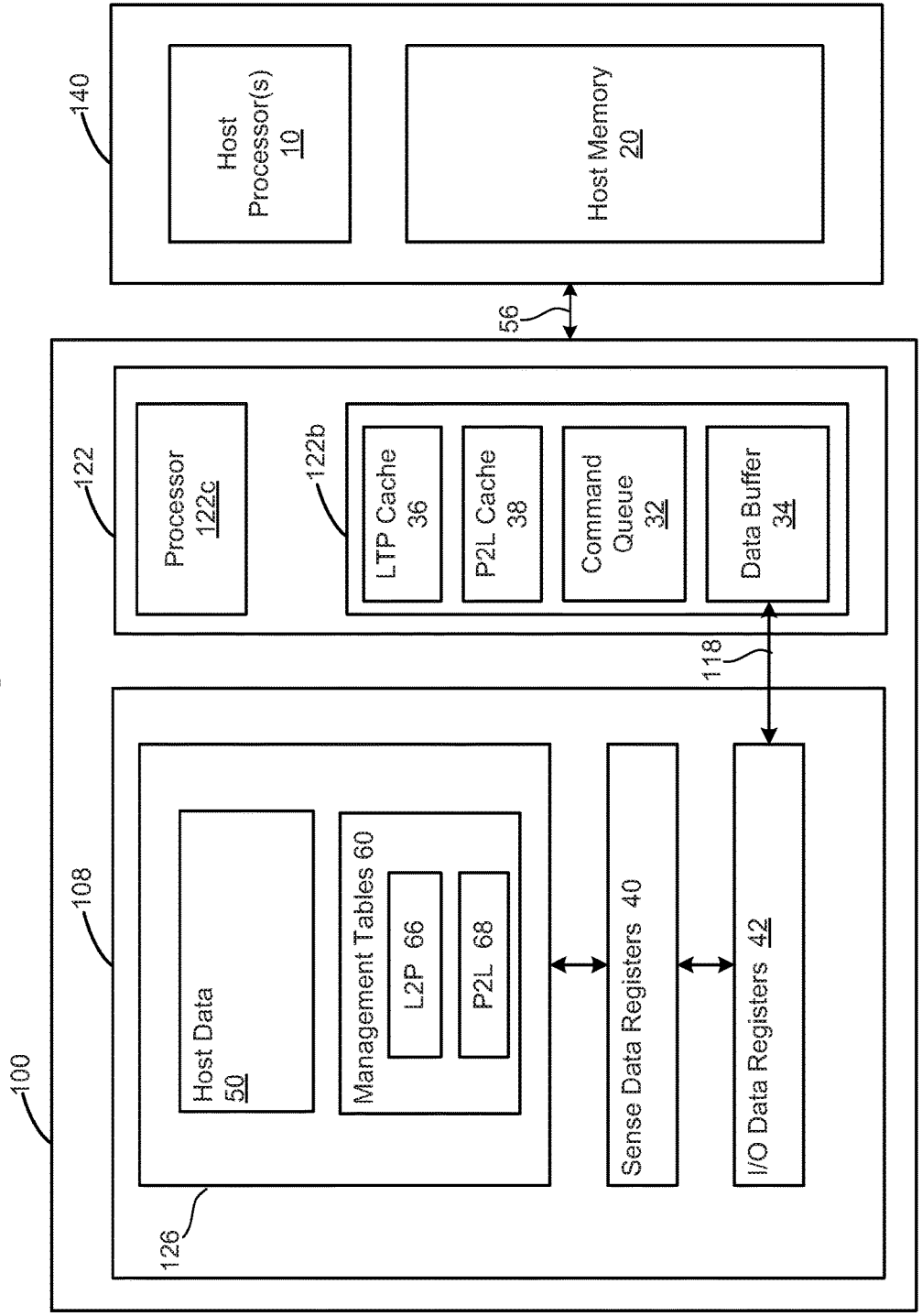
FIG. 1A is a block diagram depicting one embodiment of a storage device connected to a host device.

Storage devices, and methods for use therewith, are described herein. Such storage devices can include flash memory (non-volatile memory), random access memory (RAM), and a memory controller in communication with the flash memory and the RAM. In accordance with certain embodiments of the present technology, one or more control circuits of a storage system are configured to consolidate the sensing of pre-pad and/or post-pad data for one unaligned write command with the transferring of previously sensed pre-pad and/or post-pad data for another unaligned write command. By consolidating the sensing and transferring, considerable time is saved when programming data for a set of two or more unaligned write commands. Also, in one embodiment, data for multiple unaligned write commands is programmed concurrently. Some conventional solutions may need to perform a programming operation for each unaligned write command. In some embodiments, only one programming operation is performed for a set of two or more unaligned write commands. Hence, considerable programming time is saved by embodiments of a storage system. Also, considerable power is saved by embodiments of a storage system, by reducing the number of programming operations. Moreover, write amplification may be reduced by embodiments of a storage system. Hence, the lifespan of the storage system may be increased.

In the following detailed description, reference is made to the accompanying drawings that form a part hereof, and in which is shown by way of illustration specific illustrative embodiments. It is to be understood that other embodiments may be utilized and that mechanical and electrical changes may be made. The following detailed description is, therefore, not to be taken in a limiting sense. In the description that follows, like numerals or reference designators will be used to refer to like parts or elements throughout. In addition, the first digit of a three digital reference number, and the first two digits of a four digit reference number, identifies the drawing in which the reference number first appears.

FIG. 1A is a block diagram depicting one embodiment of a storage system 100 connected to a host device 140 (or embedded in the host device 140) that can implement embodiments of the present technology described below. Referring to FIG. 1A, the host device 140 stores data into, and retrieves data from, the storage system 100 by issuing write and read commands. The storage system 100 may be embedded in the host device 140 or may exist in the form of a card, universal serial bus (USB) drive, or other removable drive, such as a solid state disk (SSD) that is removably connected to the host device 140 through a mechanical and electrical connector. The host device 140 may be any of a number of fixed or portable data generating devices, such as a personal computer, a smartphone, a personal digital assistant (PDA), a server, a set top box, or the like. More generally, the host device 140 can include host logic that performs the functions of a smartphone, PDA, laptop, server, set top box, etc. While not specifically shown, the host can include and/or be in communication with read only memory (ROM).

The host device 140, which can be referred to more succinctly as the host 140, may include one or more host processors 10. The host processors may run one or more application programs. The application programs, when data is to be stored on or retrieved from the storage system 100, communicate through one or more operating system application programming interfaces (APIs) with a file system. The file system may be a software module executed on the processor(s) 10 and manages the files in the storage system 100. The file system manages clusters of data in logical address space. Common operations executed by a file system include operations to create, open, write (store) data, read (retrieve) data, seek a specific location in a file, move, copy, and delete files. The file system may be circuitry, software, or a combination of circuitry and software.

Communication channel 56 between the host 140 and the storage system 100 may be used to transfer commands, data, etc. The interface for communicating over the communication channel 56 may be any of a number of known interfaces, such as Secure Data (SD), Multimedia Card (MMC), Universal Serial Bus (USB) storage device, Serial Advanced Technology Attachment (SATA) and Small Computer Systems Interface (SCSI) interfaces. The host 140 may maintain a logical address range for all logical block addresses (LBAs) that have been assigned by the host 140 to data. In addition to being used to refer to the communication channel between the host 140 and the storage system 100, the reference number 56 can also be used to refer to host interface signals that are communicated over the communication channel 56.

The host 140 uses the file system to address files stored within the storage system 100, which can involve writing data to and reading data from the non-volatile memory 126 of the storage system 100. Exemplary types of file systems that can be used by the host 140 include, but are not limited to, FAT32, exFAT, ext2/3, HFS+. The storage system 100 will typically be designed to work with different types of hosts, each of which may use a different type of file system. This may result in the storage system 100 having poor write performance due to excessive pre-padding and/or post-padding of small chunks of data.

The storage system 100 includes a memory controller 122 (which can also be referred to as the controller 122) in communication with the memory die 108 via communication interface 118. Communication interface 118 may be any suitable interface, such as Open NAND Flash (ONFI) interface. The controller 122 has a processor 122c and volatile memory 122b. The volatile memory 122b may be used to store a command queue 32, which is used to store commands from the host 10. These commands may include memory access commands such as read, write, or erase. In some embodiments, the controller 122 is able to select the order of execution of the commands on the queue 32. A portion of the volatile memory 122b may be used for a data buffer 34, which may be used to store data from the host 140 to be programmed into memory 126. The data buffer 34 may also use to store data read from memory 126 to be transfer to the host 140.

A portion of the volatile memory 122b may be used to store a cache of logical to physical mappings (L2P Cache 36), as well as a cache of physical to logical mappings (P2L Cache 38). The controller 122 can use the logical to physical mappings to map logical block addresses in memory access commands from the host 140 to physical addresses of memory cells in the memory structure 126. For example, logical block addresses (LBAs) can be mapped to physical block addresses (PBAs). Such mappings can be used to directly map LBAs to the PBAs, or LBAs can be mapped to intermediate or virtual block addresses, which are mapped to PBAs.

The memory die 108 has a memory structure 126. The memory structure 126 is used to store host data 50. The memory structure 126 is also used to store management tables 60. The management tables may include L2P tables 66 and P2L tables 68. Note that the LTP cache 36 is a cache of the L2P tables 66, and that the P2L cache 38 is a cache of the P2L tables 68.

The memory die 108 has a set of sense data registers 40, which may be used to store data that was sensed from the memory cells. The sense data registers 40 may also be used to store data to be programmed into the memory cells. The sense data registers 40 are data latches, in one embodiment. The memory die 108 has a set of I/O registers 42, which may be used to store data from the memory controller 122 to be written to memory cells. The I/O registers 42 may also be used to store data read from memory cells to be transferred to the data buffer 34. The I/O registers 42 are data latches, in one embodiment.

When writing the memory structure 126, data may be transferred from host memory 20 to the data buffer 34. The memory controller 122 may transfer data from the data buffer 34 to the I/O data registers 42. The data from the I/O data registers 42 may then be transferred to the sense data registers 40. The data from the sense data registers 40 may then be programmed into memory cells in memory structure 126. Note that details such as adding parity bits to the host data are not described so as to simplify the explanation.

When reading the memory structure 126, data from the memory cells in memory structure 126 may be sensed and placed into the sense data registers 40. The data from the sense data registers 40 may then be transferred to the I/O data registers 42. The data in the I/O data registers 42 may then be transferred to the data buffer 34. The data in the data buffer 34 may then be transferred to host memory 20. Note that details such as performing error correction on the data read from memory structure 126 are not described so as to simplify the explanation.

In some embodiments disclosed herein the memory controller 122 checks the command queue 32 for unaligned writes from host 140. The unaligned write contains at least one sector of data from host, but does not completely fill a fragment in the data buffer 34. The memory controller 122 sends a command to the memory die to provide pre-pad and/or post pad data for the unaligned write in order to form a complete fragment, which is referred to herein as forming aligned data. Moreover, the memory system 100 consolidates the sensing of pre-pad and/or post-pad data for one unaligned write command with the transferring of previously sensed pre-pad and/or post-pad data for another unaligned write command. For example, while sensing data into the sense data registers 40 for one unaligned write command, the previously sensed pad data for another unaligned write command is transferred from I/O data registers 42 to the data buffer. By consolidating the sensing and transferring, considerable time is saved when handing data for a set of two or more unaligned write commands.

The memory controller 122 sends the fragments for multiple unaligned write commands to the memory die 108, which initially stores the fragments in the I/O data registers 42, in one embodiment. These fragments are then transferred to the sense data registers 40, where they may be used to program memory cells in memory structure 126. The fragments for multiple unaligned write commands are programmed concurrently, in one embodiment. Some conventional solutions may need to perform a programming operation for each unaligned write command. Hence, considerable programming time is saved. Moreover, write amplification may be reduced.

Figure 1B:
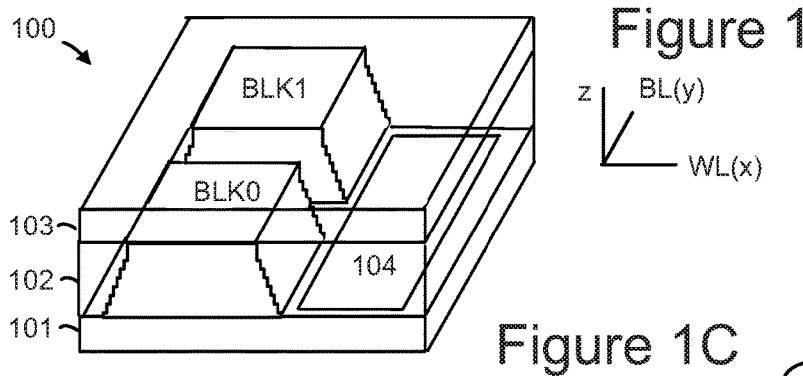
FIG. 1B is a perspective view of a three dimensional (3D) stacked non-volatile memory device.

FIGS. 1B-4 describe one example of a memory system 100 that can be used to implement the technology proposed herein. FIG. 1B is a perspective view of a three dimensional (3D) stacked non-volatile memory device. The memory device 100 includes a substrate 101. On and above the substrate are example blocks BLK0 and BLK1 of memory cells (non-volatile storage elements). Also on substrate 101 is peripheral area 104 with support circuits for use by the blocks. Substrate 101 can also carry circuits under the blocks, along with one or more lower metal layers which are patterned in conductive paths to carry signals of the circuits. The blocks are formed in an intermediate region 102 of the memory device. In an upper region 103 of the memory device, one or more upper metal layers are patterned in conductive paths to carry signals of the circuits. Each block comprises a stacked area of memory cells, where alternating levels of the stack represent word lines. While two blocks are depicted as an example, additional blocks can be used, extending in the x- and/or y-directions.

In one example implementation, the length of the plane in the x-direction, represents a direction in which signal paths for word lines extend (a word line or SGD line direction), and the width of the plane in the y-direction, represents a direction in which signal paths for bit lines extend (a bit line direction). The z-direction represents a height of the memory device.

Figure 1C:
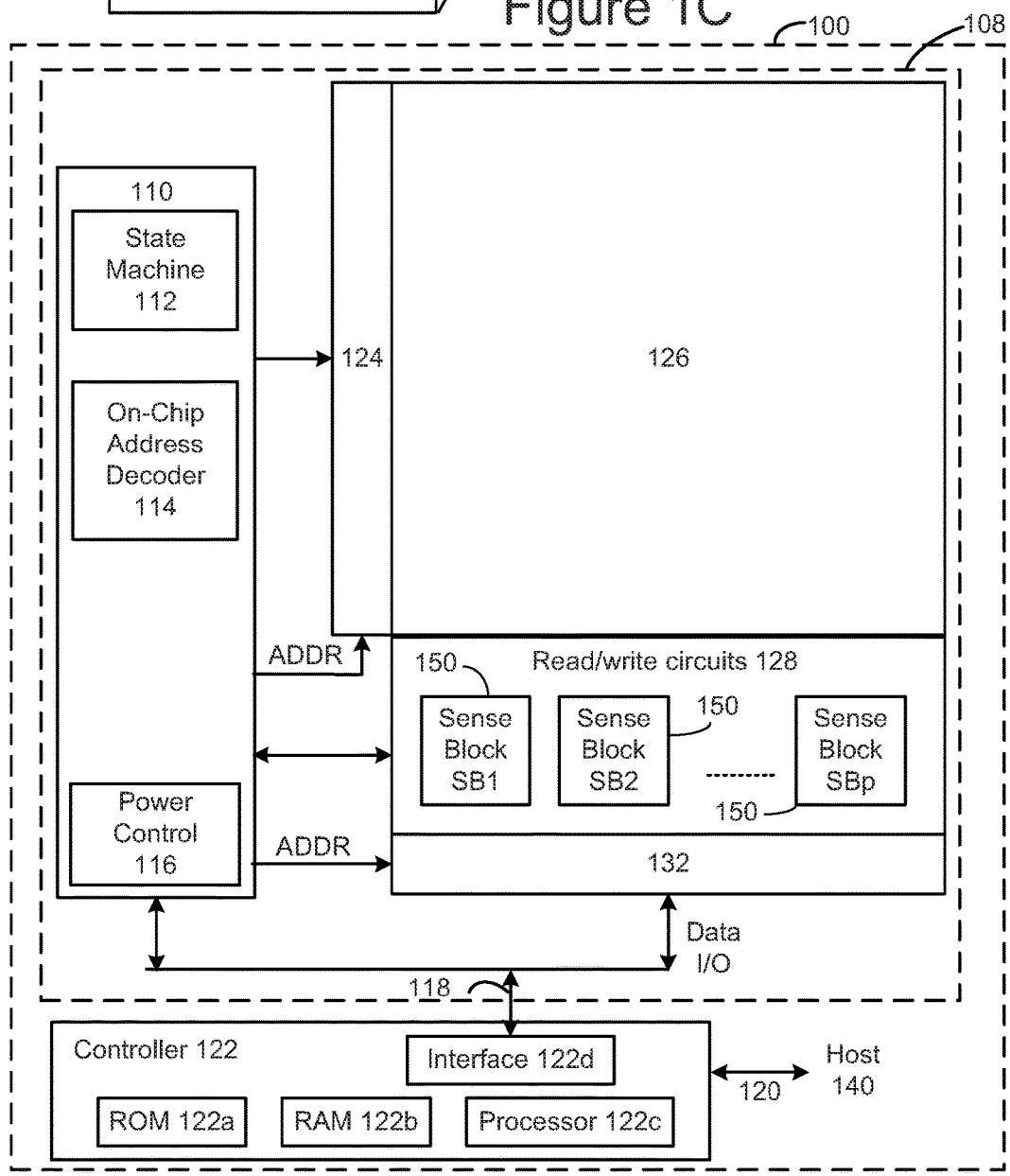
FIG. 1C is a functional block diagram of an example memory device such as the 3D stacked non-volatile memory device of FIG. 1B.

FIG. 1C is a functional block diagram of an example memory device such as the 3D stacked non-volatile memory device 100 of FIG. 1B. The components depicted in FIG. 1C are electrical circuits. Memory device 100 includes one or more memory die 108. Each memory die 108 includes a three dimensional memory structure 126 of memory cells (such as, for example, a 3D array of memory cells), control circuitry 110, and read/write circuits 128. In other embodiments, a two dimensional array of memory cells can be used. Memory structure 126 is addressable by word lines via a row decoder 124 and by bit lines via a column decoder 132. The read/write circuits 128 include multiple sense blocks 150 including SB1, SB2, . . . , SBp (sensing circuitry) and allow a page of memory cells to be read or programmed in parallel. In some systems, a controller 122 is included in the same memory device 100 (e.g., a removable storage card) as the one or more memory die 108. However, in other systems, the controller can be separated from the memory die 108. In some embodiments controller 122 will be on a different die than memory die 108. In some embodiments, one controller 122 will communicate with multiple memory die 108. In other embodiments, each memory die 108 has its own controller. Commands and data are transferred between the host 140 and controller 122 via a data bus 120, and between controller 122 and the one or more memory die 108 via lines 118. In one embodiment, memory die 108 includes a set of input and/or output (I/O) pins that connect to lines 118.

Memory structure 126 may comprise one or more arrays of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate. In one embodiment, memory structure 126 implements three dimensional NAND flash memory. Other embodiments include two dimensional NAND flash memory, two dimensional NOR flash memory, ReRAM cross-point memories, magnetoresistive memory (e.g., MRAM), phase change memory (e.g., PCRAM), and others.

Control circuitry 110 cooperates with the read/write circuits 128 to perform memory operations (e.g., erase, program, read, and others) on memory structure 126, and includes a state machine 112, an on-chip address decoder 114, a power control module 116. The state machine 112 provides die-level control of memory operations. In one embodiment, state machine 112 is programmable by the software. In other embodiments, state machine 112 does not use software and is completely implemented in hardware (e.g., electrical circuits). In one embodiment, control circuitry 110 includes registers, ROM fuses and other storage devices for storing default values such as base voltages and other parameters.

The on-chip address decoder 114 provides an address interface between addresses used by host 140 or controller 122 to the hardware address used by the decoders 124 and 132. Power control module 116 controls the power and voltages supplied to the word lines and bit lines during memory operations. It can include drivers for word line layers (discussed below) in a 3D configuration, select transistors (e.g., SGS and SGD transistors, described below) and source lines. Power control module 116 may include charge pumps for creating voltages. The sense blocks include bit line drivers. An SGS transistor is a select gate transistor at a source end of a NAND string, and an SGD transistor is a select gate transistor at a drain end of a NAND string.

Any one or any combination of control circuitry 110, state machine 112, decoders 114/124/132, power control module 116, sense blocks 150, read/write circuits 128, controller 122, processor 122c, and/or interface 122d can be considered one or more control circuits that performs the functions described herein.

The (on-chip or off-chip) controller 122 (which in one embodiment is an electrical circuit) may comprise one or more processors 122c, ROM 122a, RAM 122b, Memory Interface 122d, all of which are interconnected. Other embodiments can use state machines or other custom circuits designed to perform one or more functions. The storage devices (ROM 122a, RAM 122b) comprises code such as a set of instructions, and the processor 122c is operable to execute the set of instructions to provide at least some of the functionality described herein. Alternatively or additionally, processor 122c can access code from a storage device in the memory structure, such as a reserved area of memory cells connected to one or more word lines. Memory interface 122d, in communication with ROM 122a, RAM 122b and processor 122c, is an electrical circuit (electrical interface) that provides an electrical interface between controller 122 and one or more memory die 108. For example, memory interface 122d can change the format or timing of signals, provide a buffer, isolate from surges, latch I/O, etc. Processor 122c can issue commands to control circuitry 110 (or any other component of memory die 108) via Memory Interface 122d.

Multiple memory elements in memory structure 126 may be configured so that they are connected in series or so that each element is individually accessible. By way of non-limiting example, flash memory devices in a NAND configuration (NAND flash memory) typically contain memory elements connected in series. A NAND string is an example of a set of series-connected memory cells and select gate transistors.

A NAND flash memory array may be configured so that the array is composed of multiple NAND strings of which a NAND string is composed of multiple memory cells sharing a single bit line and accessed as a group. Alternatively, memory elements may be configured so that each element is individually accessible, e.g., a NOR memory array. NAND and NOR memory configurations are exemplary, and memory cells may be otherwise configured.

The memory cells may be arranged in the single memory device level in an ordered array, such as in a plurality of rows and/or columns. However, the memory elements may be arrayed in non-regular or non-orthogonal configurations, or in structures not considered arrays.

A three dimensional memory array is arranged so that memory cells occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in they direction) with each column having multiple memory cells. The vertical columns may be arranged in a two dimensional configuration, e.g., in an x-y plane, resulting in a three dimensional arrangement of memory cells, with memory cells on multiple vertically stacked memory planes. Other configurations of memory elements in three dimensions can also constitute a three dimensional memory array.

By way of non-limiting example, in a three dimensional NAND memory array, the memory elements may be coupled together to form vertical NAND strings that traverse across multiple horizontal levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

A person of ordinary skill in the art will recognize that the technology described herein is not limited to a single specific memory structure, but covers many relevant memory structures within the spirit and scope of the technology as described herein and as understood by one of ordinary skill in the art.

Figure 2:
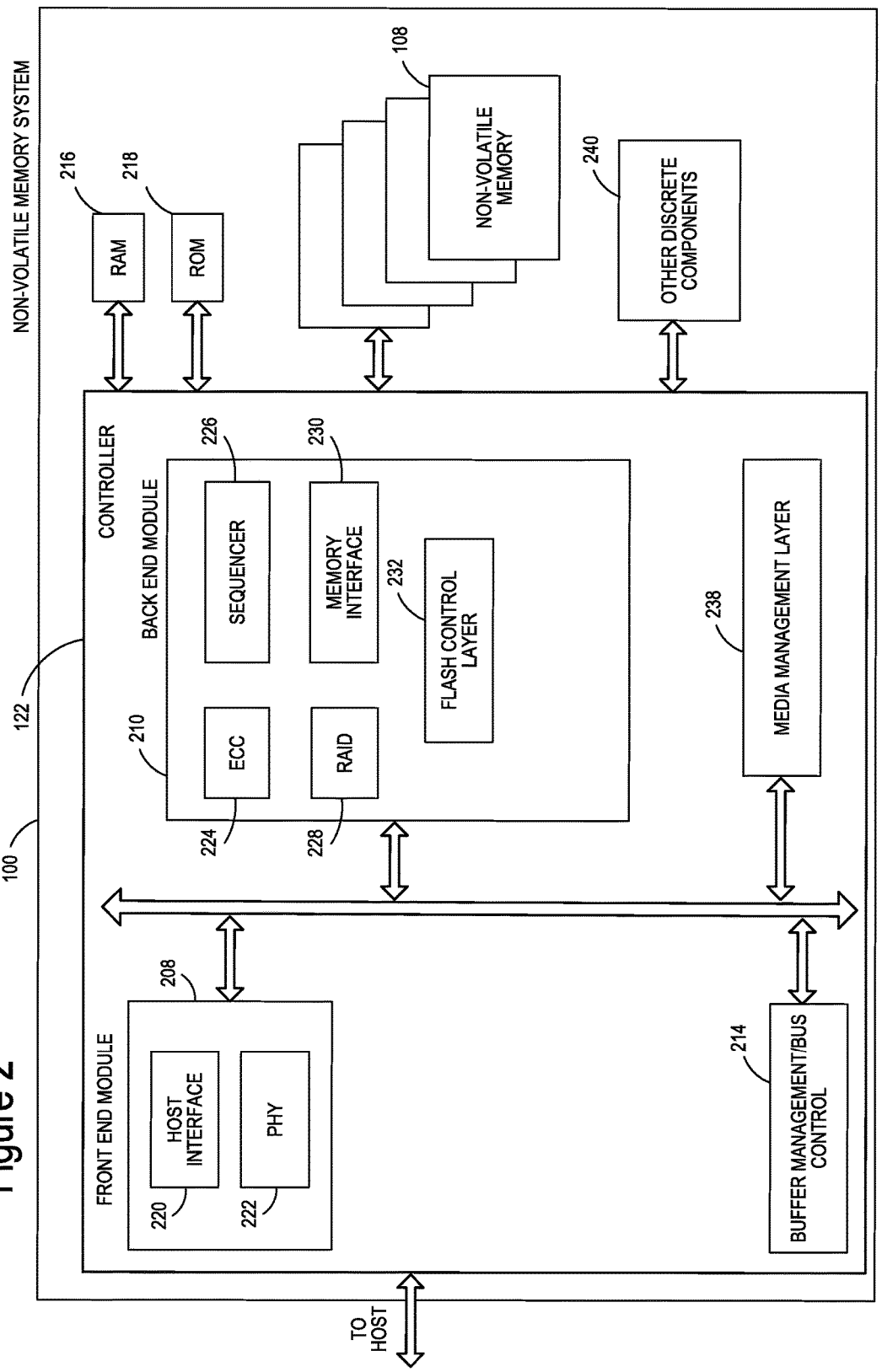
FIG. 2 is a block diagram of example memory system, depicting more details of one embodiment of controller.

FIG. 2 is a block diagram of example memory system 100, depicting more details of one embodiment of controller 122. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between controller 122 and non-volatile memory die 108 may be any suitable flash interface, such as Toggle Mode 200, 400, or 800. In one embodiment, memory system 100 may be a card based system, such as a secure digital (SD) or a micro secure digital (micro-SD) card. In an alternate embodiment, memory system 100 may be part of an embedded memory system. For example, the flash memory may be embedded within the host. In other example, memory system 100 can be in the form of a solid state drive (SSD) drive.

In some embodiments, non-volatile memory system 100 includes a single channel between controller 122 and non-volatile memory die 108, the subject matter described herein is not limited to having a single memory channel. For example, in some memory system architectures, 2, 4, 8 or more channels may exist between the controller and the memory die, depending on controller capabilities. In any of the embodiments described herein, more than a single channel may exist between the controller and the memory die, even if a single channel is shown in the drawings.

As depicted in FIG. 2, controller 122 includes a front end module 208 that interfaces with a host, a back end module 210 that interfaces with the one or more non-volatile memory die 108, and various other modules that perform functions which will now be described in detail.

The components of controller 122 depicted in FIG. 2 may take the form of a packaged functional hardware unit (e.g., an electrical circuit) designed for use with other components, a portion of a program code (e.g., software or firmware) executable by a (micro) processor or processing circuitry that usually performs a particular function of related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include software stored in a processor readable device (e.g., memory) to program a processor for controller 122 to perform the functions described herein. The architecture depicted in FIG. 2 is one example implementation that may (or may not) use the components of controller 122 depicted in FIG. 1A or 1C (i.e. RAM, ROM, processor, interface).

Referring again to modules of the controller 122, a buffer manager/bus control 214 manages buffers in random access memory (RAM) 216 and controls the internal bus arbitration of controller 122. A read only memory (ROM) 218 stores system boot code. Although illustrated in FIG. 2 as located separately from the controller 122, in other embodiments one or both of the RAM 216 and ROM 218 may be located within the controller. In yet other embodiments, portions of RAM and ROM may be located both within the controller 122 and outside the controller. Further, in some implementations, the controller 122, RAM 216, and ROM 218 may be located on separate semiconductor die.

Front end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction code (ECC) engine 224 that encodes the data bytes received from the host, and decodes and error corrects the data bytes read from the non-volatile memory. A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the non-volatile memory system 100. In some cases, the RAID module 228 may be a part of the ECC engine 224. Note that the RAID parity may be added as an extra die or dies as implied by the common name, but it may also be added within the existing die, e.g. as an extra plane, or extra block, or extra WLs within a block. A memory interface 230 provides the command sequences to non-volatile memory die 108 and receives status information from non-volatile memory die 108. In one embodiment, memory interface 230 may be a double data rate (DDR) interface, such as a Toggle Mode 200, 400, or 800 interface. A flash control layer 232 controls the overall operation of back end module 210.

Additional components of system 100 illustrated in FIG. 2 include media management layer 238, which performs wear leveling of memory cells of non-volatile memory die 108. System 100 also includes other discrete components 240, such as external electrical interfaces, external RAM, resistors, capacitors, or other components that may interface with controller 122. In alternative embodiments, one or more of the physical layer interface 222, RAID module 228, media management layer 238 and buffer management/bus controller 214 are optional components that are not necessary in the controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, the MML 238 may include an algorithm in the memory device firmware which translates writes from the host into writes to the flash memory 126 of die 108. The MML 238 may be needed because: 1) the flash memory may have limited endurance; 2) the flash memory 126 may only be written in multiples of ECC pages; and/or 3) the flash memory 126 may not be written unless it is erased as a block. The MML 238 understands these potential limitations of the flash memory 126 which may not be visible to the host. Accordingly, the MML 238 attempts to translate the writes from host into writes into the flash memory 126. As described below, erratic bits may be identified and recorded using the MML 238. This recording of erratic bits can be used for evaluating the health of blocks and/or word lines (the memory cells on the word lines).

Controller 122 may interface with one or more memory dies 108. In one embodiment, controller 122 and multiple memory dies (together comprising non-volatile storage system 100) implement a solid state drive (SSD), which can emulate, replace or be used instead of a hard disk drive inside a host, as a NAS device, laptop, tablet, etc. Additionally, the SSD need not be made to work as a hard drive.

Figure 3A:
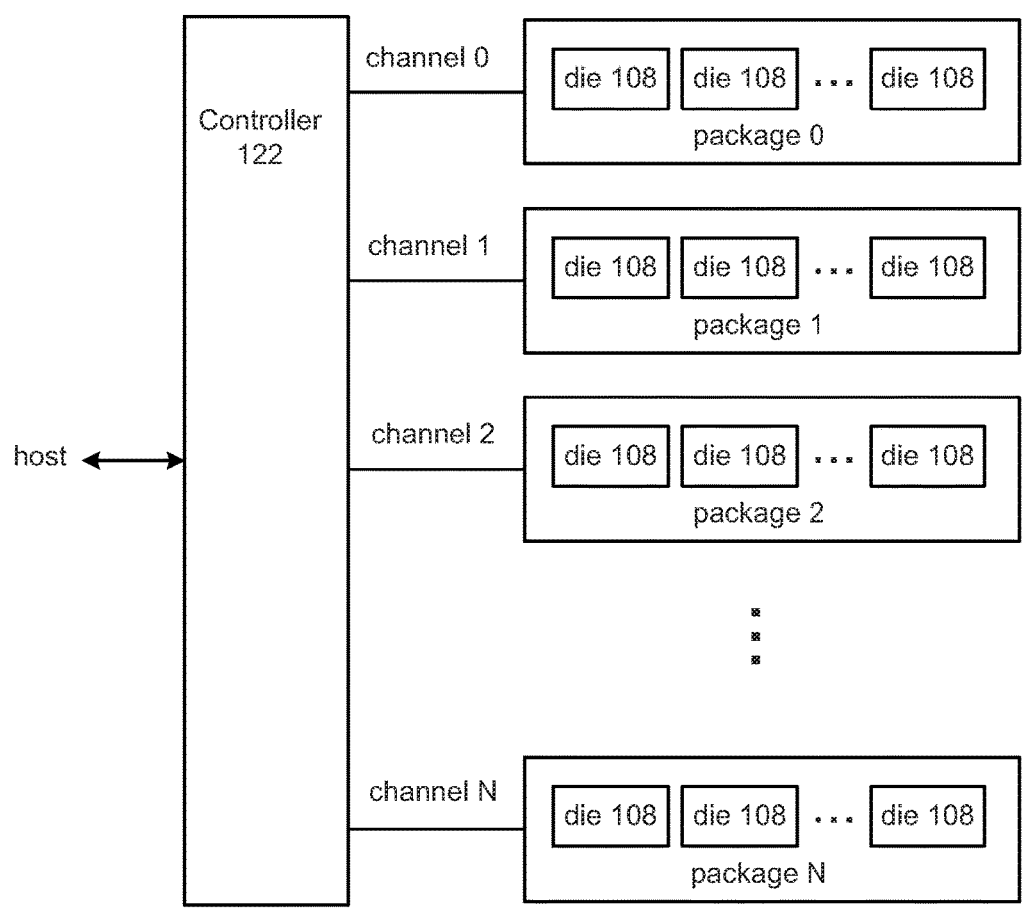
FIG. 3A shows N+1 memory packages (package 0-package N), and N+1 channels (channel 0-channel N) for communication between controller and the memory dies of respective memory packages 0-N.

Some embodiments of a non-volatile storage system will include one memory die 108 connected to one controller 122. However, other embodiments may include multiple memory die 108 in communication with one or more controllers 122. In one example, depicted in FIG. 3A, the multiple memory die can be grouped into a set of memory packages. Each memory package includes one or more memory die in communication with controller 122. FIG. 3A shows N+1 memory packages (package 0-package N), and N+1 channels (channel 0-channel N) for communication between controller 122 and the memory dies 108 of respective memory packages 0-N. In one embodiment, a memory package includes a printed circuit board (or similar structure) with one or more memory die 108 mounted thereon. In some embodiments, a memory package can include molding material to encase the memory dies 108 of the memory package. In one embodiment, a memory package can be a single memory die 108. In some embodiments, controller 122 is physically separate from any of the memory packages.

Figure 3B:
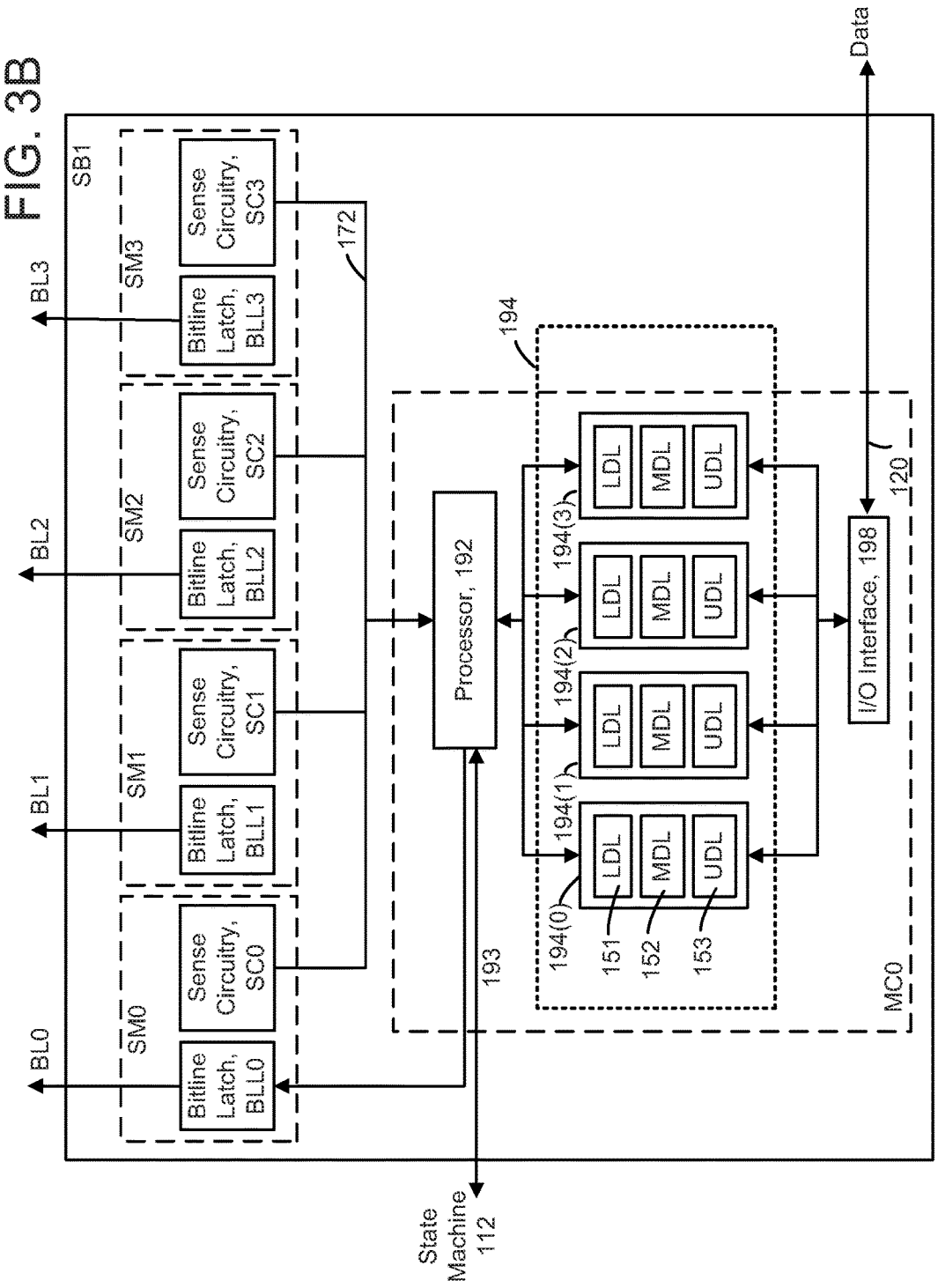
FIG. 3B is a block diagram depicting one embodiment of the sense block SB1 of FIG. 1C.

FIG. 3B is a block diagram depicting one embodiment of the sense block SB1 of FIG. 1C. The sense block is partitioned into one or more core portions, referred to as sense modules (e.g., SM0) or sense amplifiers, and a common portion, referred to as a managing circuit (e.g., MC0).

In one embodiment, there is a separate sense module for each bit line and one common managing circuit for a set of sense modules, such as SM0, SM1, SM2 and SM3. Each of the sense modules in a group communicates with the associated managing circuit via a data bus 172. Thus, there are one or more managing circuits which communicate with the sense modules of a set of memory cells.

Each sense module SM0, SM1, SM2 and SM3 comprises sense circuitry SC0, SC1, SC2 and SC3, respectively, that performs sensing by determining whether a conduction current in a connected bit line BL0, BL1, BL2 and BL3, respectively, is above or below a predetermined threshold voltage (verify voltage). Each sense module SM0, SM1, SM2 and SM3 also includes a bit line latch BLL0, BLL1, BLL2 and BLL3, respectively, that is used to set a voltage condition on the connected bit line. For example, during a programming operation, a predetermined state latched in a bit line latch will result in the connected bit line being pulled to a lockout state (e.g., 1.5-3 V), a slow programming state (e.g., 0.5-1 V) or a normal programming state (e.g., 0 V).

Managing circuit MC0 comprises a processor 192, four example sets of data latches 194(0), 194(1), 194(2) and 194(3) and an I/O interface 198 coupled between the sets of data latches 194 and the data bus 120. The combination of the Bitline Latches (BLL0-BLL3) and the latches 194 are one embodiment of sense data registers 40. The I/O interface 198 is one embodiment of I/O data registers 42.

In this example, each set of latches is associated with one of the bit lines. For example, data latches 194(0) are associated with bit line BL0, data latches 194(1) are associated with bit line BL1, data latches 194(2) are associated with bit line BL2, and data latches 194(3) are associated with bit line BL3. Each set of data latches includes data latches identified by LDL 151, MDL 152, and UDL 153, in this embodiment. LDL 151 stores a bit for a lower page (LP) of write data, MDL 152 stores a bit for a middle page (MP) of write data, and UDL 153 stores a bit for an upper page (UP) of write data, in a memory which stores three bits of data in each memory cell. Note that there may be one set of such latches associated with each bit line. The latches 194 may also be used to store data read from the non-volatile memory cells.

Additional or fewer data latches per set could be used as well. For example, in a two-bit per memory cell implementation, the MDL data latch for the middle page (MP) of data is not needed. A four-bit per memory cell implementation can use LDL, LMDL (lower-middle page), UMDL (upper-middle page), and UDL latches. The techniques provided herein are meant to encompass such variations. In a further option, another latch is used to identify whether a memory cell is in a slow programming mode when its Vth is within a specified margin of the verify voltage of its target data state.

The processor 192 performs computations during reading and programming. For reading, the processor determines the data state stored in the sensed memory cell and stores the data in the set of data latches. For full programming and refresh programming, the processor reads the latches to determine the data state which is to be written to a memory cell.

During reading, the operation of the system is under the control of the state machine 112 which controls the supply of different control gate voltages to the addressed memory cell. As it steps through the various predefined control gate voltages corresponding to the various memory states supported by the memory, the sense module may trip at one of these voltages and a corresponding output will be provided from the sense module to the processor 192 via the data bus 172. At that point, processor 192 determines the memory state by consideration of the tripping event(s) of the sense module and the information about the applied control gate voltage from the state machine via input lines 193. It then computes a binary encoding for the memory state and stores the resultant data bits into the data latches 194. For example, the memory state for a memory cell associated with bit line BL0 may be stored in latches 194(0), etc. In another embodiment of the managing circuit MC0, the bit line latch serves both as a latch for latching the output of the sense module and also as a bit line latch as described above.

Some implementations can include multiple processors. In one embodiment, each processor will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with four sense modules, the state machine needs to read the wired-OR line four times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations, the data to be programmed (write data) is stored in the data latches 194 from the data bus 120, in the LP, MP, and UP data latches. For example, the data to be programmed in a selected memory cell associated with bit line BL0 may be stored in latches 194(0), the data to be programmed in a selected memory cell associated with bit line BL1 may be stored in latches 194(1), etc. The programming operation, under the control of the state machine, comprises a series of programming voltage pulses applied to the control gates of the addressed memory cells. Each programming voltage is followed by a read back (verify test) to determine if the memory cell has been programmed to the desired memory state. In some cases, processor monitors the read back memory state relative to the desired memory state. When the two states agree, the processor sets the bit line latch to cause the bit line to be pulled to a state designating program inhibit (e.g., 2-3 V). This inhibits the memory cell coupled to the bit line from further programming even if programming voltages appear on its control gate. In other embodiments, the processor initially loads the bit line latch and the sense circuitry sets it to an inhibit value during the verify process.

Each set of data latches 194 may be implemented as a stack of data latches for each sense module. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Figure 4A:
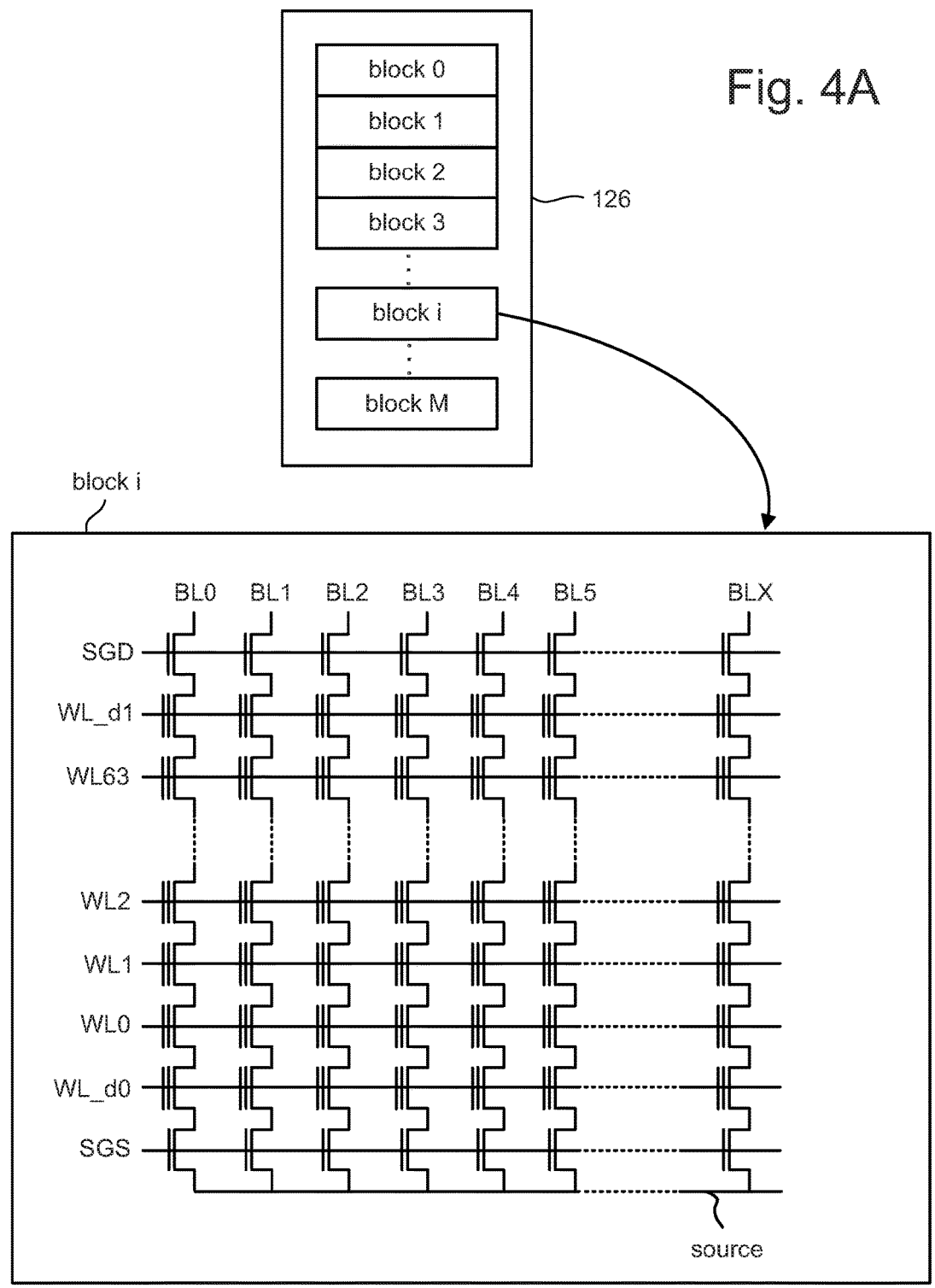
FIG. 4A depicts an exemplary structure of memory cell array.

FIG. 4A depicts an exemplary structure of memory cell array 126. In one embodiment, the array of memory cells is divided into M blocks of memory cells. The block is the unit of erase. That is, each block contains the minimum number of memory cells that are erased together. Each block is typically divided into a number of pages. Note that herein, these pages may be referred to as "ECC pages." An ECC page is a unit of programming. One or more ECC pages of data are typically stored in one row of memory cells. An ECC page can store one or more sectors. A sector includes user data and overhead data. Overhead data typically includes parity bits of an Error Correction Code (ECC) that have been calculated from the user data of the sector. A portion of the controller calculates the ECC parity when data is being programmed into the array, and also checks it when data is being read from the array. Alternatively, the ECCs and/or other overhead data are stored in different ECC pages, or even different blocks, than the user data to which they pertain.

FIG. 4A also shows more details of one embodiment of block i of memory array 126. Block i includes X+1 bit lines and X+1 NAND strings. There may be thousands of NAND strings in a block. Block i also includes 64 data word lines (WL0-WL63), 2 dummy word lines (WL_d0 and WL_d1), a drain side select line (SGD) and a source side select line (SGS). One terminal of each NAND string is connected to a corresponding bit line via a drain select gate (connected to select line SGD), and another terminal is connected to the source line via a source select gate (connected to select line SGS). Because there are sixty four data word lines and two dummy word lines, each NAND string includes sixty four data memory cells and two dummy memory cells. In other embodiments, the NAND strings can have more or fewer than 64 data memory cells and more or fewer dummy memory cells. Data memory cells can store user or system data. Dummy memory cells are typically not used to store user or system data. Some embodiments do not include dummy memory cells.

In some embodiments, programming is performed one word line at a time. That is, only memory cells connected to one word line are programmed at one time. Moreover, for efficiency, when programming a word line, all of the memory cells on the word line may be programmed. Typically, multiple ECC pages are programmed into the memory cells associated with one word line. The number of ECC pages may depend on how many bits are programmed per memory cell. For example, if one bit is programmed per memory cell, then four, eight, sixteen, or some other number of ECC pages might be programmed per word line.

Memory cells may be programed to store two levels of charge (or some other physical parameter such as resistance) so that a single bit of data is stored in each cell. This is typically referred to as a binary or single level cell (SLC) memory. SLC memory may store two states. Alternatively, the memory cells may be operated to store more than two detectable levels of charge (or some other physical parameter such as resistance), thereby to store more than one bit of data in each. This latter configuration is referred to as multi-level cell (MLC) memory. For example, MLC memory may store four states and can retain two bits of data. As another example, MLC memory may store eight states and can retain three bits of data. Both types of memory cells may be used in a memory, for example binary SLC flash memory may be used for caching data and MLC memory may be used for longer term storage. In some embodiments, the memory system has a pool of blocks used for SLC programming and a pool of blocks used for MLC programmed. These are referred to as SLC block and MLC blocks, respectively. In one embodiment, the memory controller 122 initially stores host data in SLC blocks, and then performs a folding operation in which data is transferred from one or more SLC blocks to an MLC block.

Figure 4B:
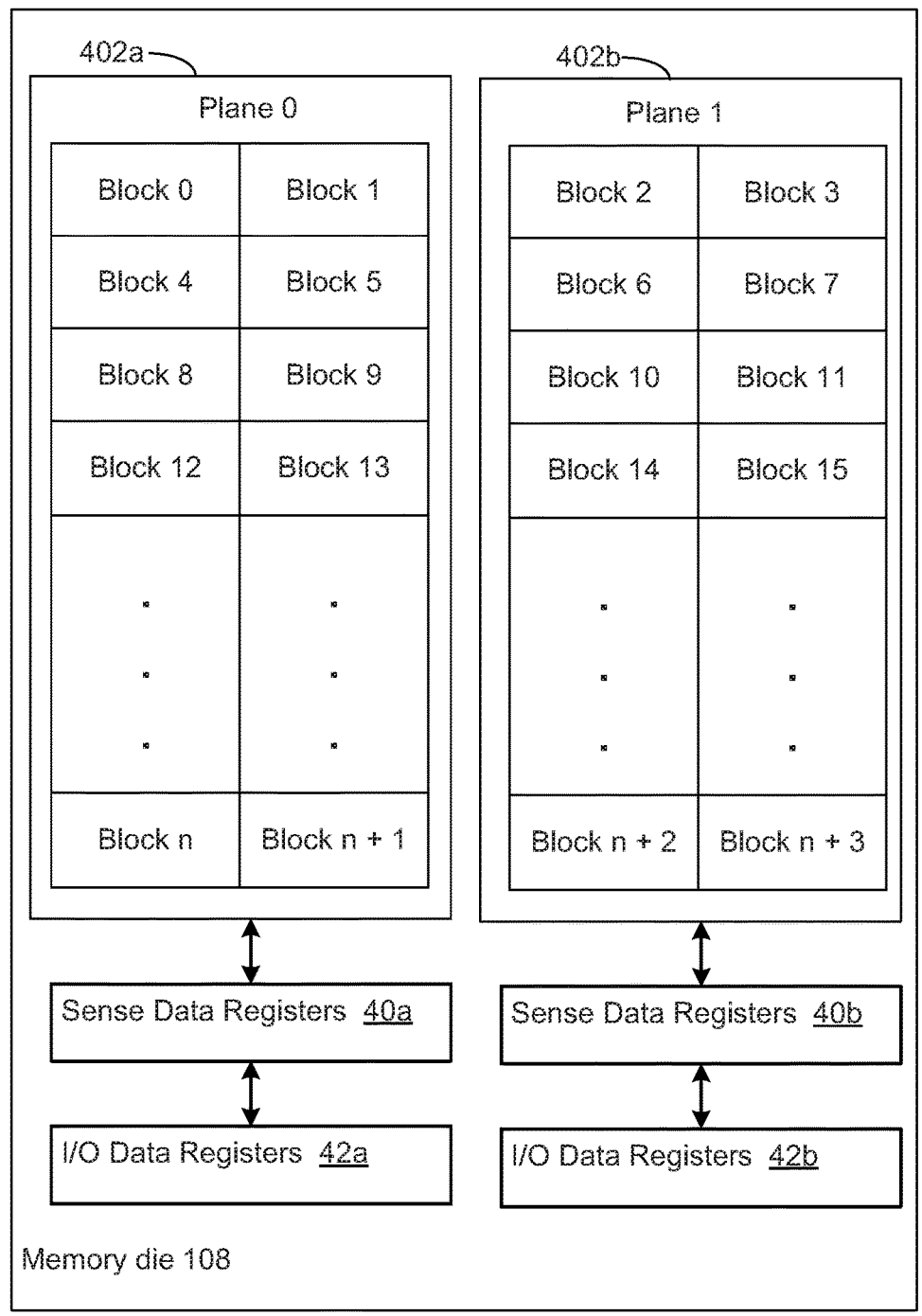
FIG. 4B depicts one example of a memory die having two planes.

To achieve better parallelism, a memory die (or other logical unit) can be divided into multiple planes. A plane may be defined as a unit that is able to report its own operating status and can perform command execution independent of other planes in the memory die. For example, each plane may have its own data registers, data buffers, etc., to enable independent command operation. FIG. 4B depicts one example of a memory die 108 having two planes (Plane 0, 402a; Plane 1, 402b). In this example, Plane 0 has Blocks 0, 1, 4, 5, 8, 9, 12, 13, . . . n, n+1. Plane 1 has Blocks 2, 3, 6, 7, 10, 11, 14, 15, n+2, n+3. This is just one example of how blocks might be addressed for a two plane memory die 108.

Note that Sense Data Registers 40a are able to store data sensed from a group of memory cells in one of the blocks in Plane 0 402a. Likewise, Sense Data Registers 40b are able to store data sensed from a group of memory cells in one of the blocks in Plane 1 402b. Thus, memory cells in one block in Plane 0 may be sensed concurrently with memory cells in one block in Plane 1.

Moreover, data in Sense Data Registers 40a may be used to store data to be programmed into a group of memory cells in one of the blocks in Plane 0 402a. Likewise, data in Sense Data Registers 40b may be used to store data to be programmed into a group of memory cells in one of the blocks in Plane 1 402b. Thus, memory cells in one block in Plane 0 may be programmed concurrently with memory cells in one block in Plane 1. Moreover, there is a separate set of I/O data registers 42a, 42b associated with each plane 402a, 402b.

In one embodiment, the memory die programs one or more ECC pages into a group of memory cells in one of the blocks in Plane 0, while also programming one or more ECC pages into a group of memory cells in one of the blocks in Plane 1. Only one word line in a plane is programmed at one time, in some embodiments. Hence, the memory die programs multiple ECC pages into memory cells on one word line in Plane 0, while also programming multiple ECC pages into memory cells on one word line in Plane 1, in one embodiment. Herein, the term "maximum unit of programming" refers to the maximum amount of data that can be concurrently programmed into memory cells on a memory die 108. The maximum unit of programming will depend on the number of bits programmed per memory cell. For example, the memory die could concurrently program eight ECC pages into a block in Plane 0, and another eight ECC pages into a block in Plane 1, if programming a single bit per memory cell. Thus, the maximum unit of programming in this SLC example is 16 ECC pages. Note that the maximum number of memory cells that can be concurrently programmed does not depend on the number of bits per cell, in one embodiment.

As noted above, a fragment is defined herein as the minimal addressable unit of memory in the storage device. In one embodiment, a fragment includes a group of memory cells in a block on Plane 0 and a group of memory cells in a block Plane 1. For example, to program one fragment, one ECC page is programmed in memory cells in a block on Plane 0 and another ECC page is programmed in a group of memory cells in a block Plane 1, in one embodiment. Further note that in some embodiments the maximum unit of programming is multiple fragments.

Figure 5:
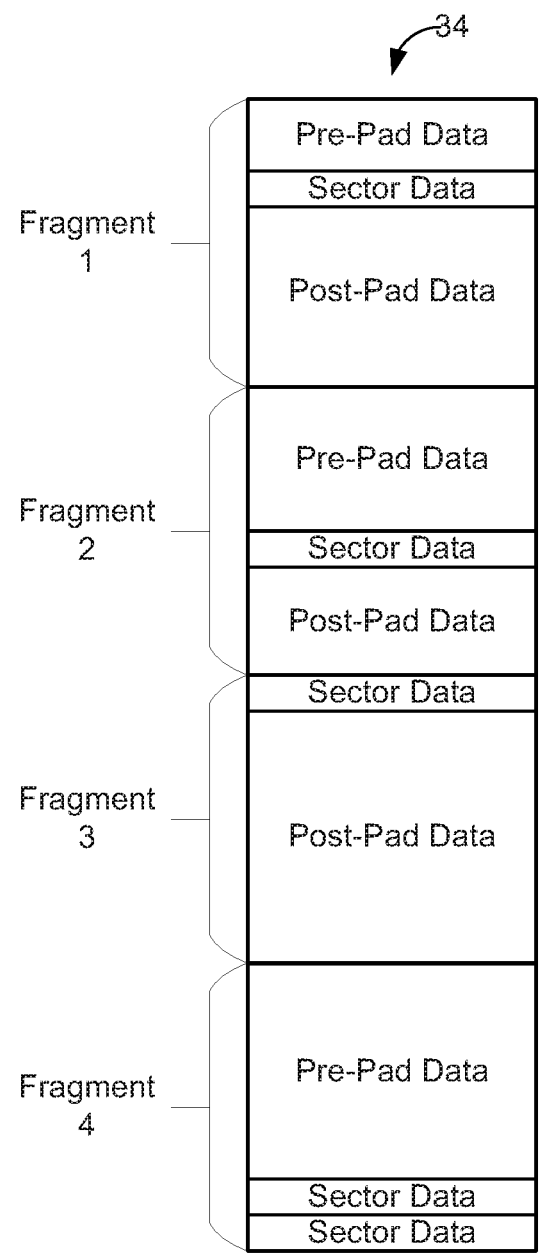
FIG. 5 shows how data for unaligned write commands in a data buffer may be pre-padded and/or post-padded to make a complete fragment.

FIG. 5 shows how data for unaligned write commands in a data buffer 34 may be pre-padded and/or post-padded to make a complete fragment. Four fragments are shown in data buffer 34. Note that data buffer 34 refers to a portion of physical memory (e.g., RAM 122b) that is used to temporarily store data while it is being transferred between host 140 and storage 126. Each fragment corresponds to one unaligned write command. In this example, the sector data for each unaligned write command is less than a fragment in size.

For Fragment 1, there is both pre-pad data and post-pad data. The sector data is data from the host that is to be written for the unaligned write command. The pre-pad data and post-pad data are obtained by reading memory cells associated with the fragment, in one embodiment. For example, prior to the write, the fragment may have been mapped to a certain physical location on a memory die.

For Fragment 2, there is also both pre-pad data and post-pad data. For Fragment 3, there is post-pad data, but no pre-pad data is needed as the sector data is at the beginning of the fragment. For Fragment 4, there is pre-pad data, but no post-pad data is needed, as the sector data is at the end of the fragment. Also, in fragment 4, there are two sectors of sector data. Note that as defined herein, unaligned data does not fill a fragment. Thus, there is always pre-pad data and/or post pad data for unaligned sector data.

Figure 6:
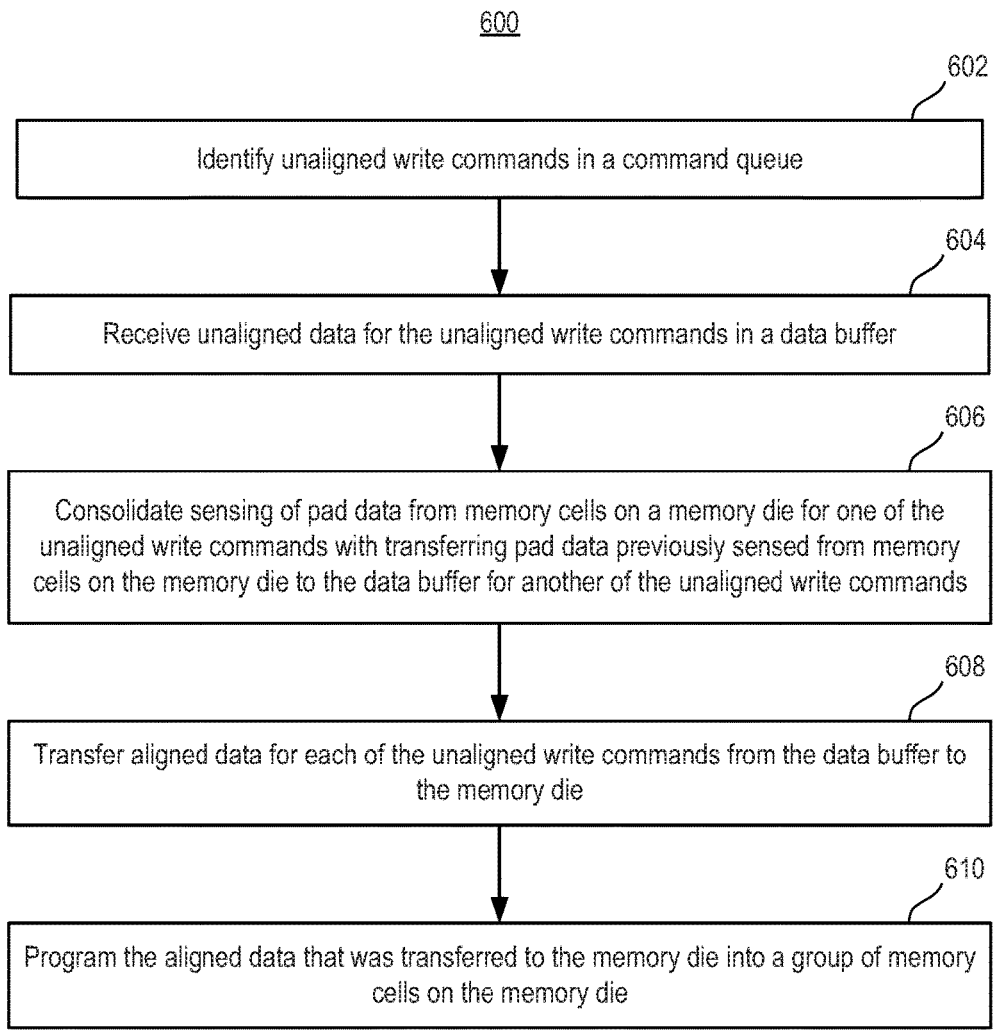
FIG. 6 is a flowchart of a process of handing unaligned write commands.

FIG. 6 is a flowchart of a process 600 of handing unaligned write commands. The unaligned write commands may be random unaligned write commands. A random unaligned write command is an unaligned write command that does not completely fill at least one fragment, in one embodiment. The process 600 is implemented in a memory system 100 such as, but not limited to, the memory systems in FIG. 1A, 1B, 1C, 2, or 3A. When discussing process 600, reference will be made to various elements in FIGS. 1A, 4B, and 5. The process 600 is initiated after a host 140 has sent at least two unaligned write commands to the memory system 100. The commands are stored in command queue 32, in one embodiment. Note that the steps are described in a certain order in process 600 in order to facilitate explanation. The steps may be performed in a different order. Also, some of the steps can be performed more than once.

Step 602 includes identifying unaligned write commands in the command queue 32. In one embodiment, an unaligned write command is identified by the memory controller 122 as follows. Any write command that has a starting LBA that is not a multiple of the number of sectors in a fragment is identified as an unaligned write command. Also, any write command that has a data size that is not equal to the fragment size is an unaligned write command. Note that the process does not proceed to step 604 unless there are at least two unaligned write commands. In one embodiment, step 602 includes identifying random write commands.

Step 604 includes receiving unaligned data for the unaligned write commands in a data buffer 34. In one embodiment, memory controller 122 initiates a transfer of data from host memory 20 to the data buffer 34. With reference to FIG. 5, sector data is received from host 140 and placed into an appropriate location in the data buffer 34. This includes placing the sector data into a fragment, and also at an offset into the fragment. Note that step 604 is described at this point in process 600 as a matter of convenience. Some, or all, of the sector data could be received after step 606.

Step 606 includes consolidating sensing of pad data from memory cells on a memory die for one of the unaligned write commands with transferring data previously sensed from memory cells on the memory die to the data buffer for another of the unaligned write commands. The "pad data" for a given fragment includes "pre-pad data" and/or "post-pad data." For example, the pad data for fragment 2 is sensed from memory cells on a memory die while transferring previously sensed pad data for fragment 1. In one embodiment, the sense data registers 40 are first used to store pad data for fragment 1 that was sensed from memory cells on a memory die 108. The pad data for fragment 1 is then transferred to I/O data registers 42. Then, the sense data registers 40 are used to store pad data for fragment 2 that was sensed from memory cells on the memory die 108 while concurrently transferring the pad data for fragment 1 from the I/O registers 42 to the data buffer 24. This concurrent sensing and transferring can be applied for other pairs of fragments. Also, note that since there is one unaligned write command per fragment in this example, this may be referred to as concurrent sensing and transferring of pad data for pairs of unaligned write commands. Furthermore, note that the sector data for the unaligned write commands could be transferred to the data buffer 34 either before or after the pad data has been added to the data buffer 34.

After steps 606 and 608, aligned data has been created for the unaligned write commands. With reference to FIG. 5, each fragment each complete. By a "complete fragment" it is meant that all needed pre-pad and/or post-pad data has been added to the fragment, along with the host sector data. Thus, it may be stated that each of the four fragments in the data buffer 34 is a complete fragment of aligned data.

Step 608 is to transfer aligned data for each of the unaligned write commands from the data buffer 34 to the memory die 108. Stated another way, step 608 includes transferring a complete fragment of data for each of the unaligned write commands from the data buffer 34 to the memory die 108. Note that the controller 122 may perform some other processing of the data prior to transfer to the memory die 108. For example, the controller 122 may form one or more ECC pages by adding parity bits to the data in the data buffer 34. In one embodiment, the memory controller 122 collects enough data for a maximum unit of programming, such that the number of complete fragments transferred in step 608 is equal to the maximum unit of programming.

Step 610 includes programming the aligned data that was transferred to the memory die into a group of memory cells in the memory die. Stated another way, step 610 includes programming the complete fragments of data that were transferred to the memory die into a group of memory cells on the memory. Note that the memory cells could be on two or more planes. In one embodiment, the memory die concurrently programs all of the aligned data into the group of memory cells on the memory die. Note that the group of memory cells could be on one or more planes of the memory die. Thus, there could be one programming operation on one memory die being performed concurrently with another programming operation on another memory die. Thus, step 610 may include programming all of the aligned data for the unaligned write commands into the group of memory cells on the memory die in a single programming operation per plane. The memory cells could be programmed to one bit per cell, two bits per cell, three bits per cell, etc. Thus, multiple unaligned write commands can be programmed concurrently. This saves time and reduces write amplification. This also saves power.

Figure 7:
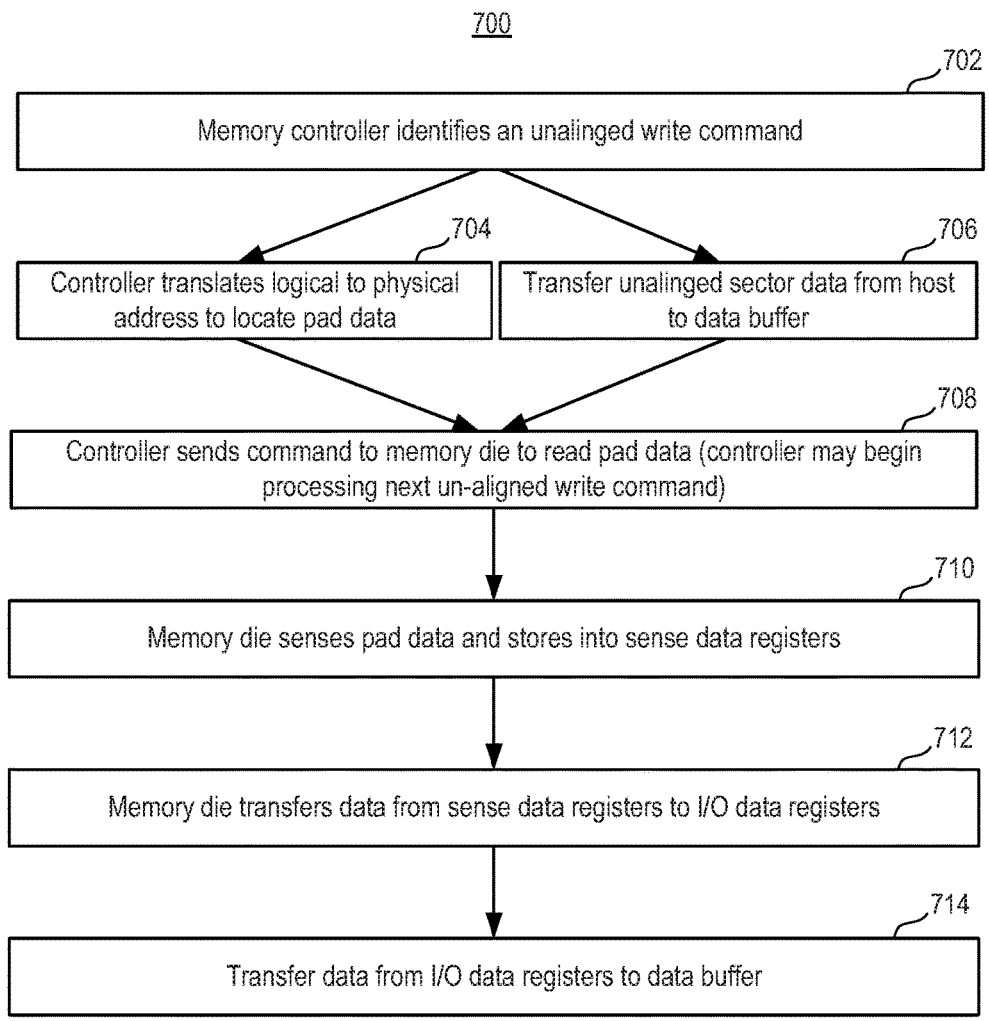
FIG. 7 is a flowchart of one embodiment of a process of forming aligned data for an unaligned write command.

FIG. 7 is a flowchart of one embodiment of a process 700 of forming aligned data for an unaligned write command. The process 700 may be used to form a complete fragment in a data buffer 34 for one unaligned write command. For example, the process 700 may be used to add sector data, as well as pre-pad and/or post-pad data for a fragment to data buffer 34. The process 700 is implemented in a memory system 100 such as, but not limited to, the memory systems in FIG. 1A, 1B, 1C, 2, or 3A. When discussing process 700, reference will be made to various elements in FIGS. 1A, 4B, and 5. Note that for convenience of explanation, the process 700 describes processing of data for one unaligned write command. However, as will be explained below, while one stage of the process 700 is performed for unaligned write command, another stage of the process may be performed for another unaligned write command.

Step 702 includes the memory controller 122 identifying an unaligned write command. This is one embodiment of step 602 of process 600 for one unaligned command.

Steps 704 and 706 may be performed in parallel. However, it is not required that steps 704 and 706 be performed in parallel. Step 704 includes the memory controller 122 translating the logical address in the unaligned write command to a physical address in the memory system 100. Note that the physical address identifies one of the memory die 108, in one embodiment. The physical address is for a minimal addressable unit, in one embodiment. As noted, the term "fragment" is used herein to refer to the minimal addressable unit of memory in the storage device. The memory controller 122 uses a logical to physical translation table in one embodiment step 704. Note that in some embodiments only a L2P cache 36 of the logical to physical translation table 66 is maintained in RAM 122b. Thus, if the necessary entry is not in the L2P cache 36, the memory controller 122 may access the L2P table 66 in the memory structure 126.

Step 706 includes transferring the unaligned sector data from the host 140 to the data buffer 34. Step 706 is one embodiment of step 604 of process 600 for one unaligned command.

Step 708 includes the memory controller 122 sending a command to the memory die 108 to read pad data for the unaligned write command. The command may identify a larger group of memory cells than is actually needed for pad data. For example, the command may instruct the memory die to read memory cells on an entire word line in certain block, even though the pad data is only stored in a subset of the memory cells. This is because the memory die 108 generally senses one word line of memory cells in a read operation, in some embodiments. Also note that the command could request the memory die to sense memory cells on more than one plane. For example, with reference to FIG. 4B, the command might instruct the memory die to read a word line in Block 8 on Plane 0, and a word line on Block 10 in Plane 1. Also note that in some circumstance, more than one memory die could be sensed to obtain pad data. Thus, the memory controller 122 could, in some cases, send read commands to more than one memory die. Note that a word line to be read is referred to as a selected word line, and a block having a selected word line is referred to as a selected block. The read command is an ONFI command, in one embodiment.

Note that after step 708, the memory controller 122 could begin process 700 for another unaligned write command. Thus, in one embodiment, after step 708, the controller 122 performs step 702 for another unaligned write command. Alternatively, the other unaligned write command may have already been identified in which case step 704 and/or 706 may be performed for the next unaligned write command. Further details of such processing will be discussed below.

Step 710 includes the memory die 108 sensing pad data and storing the pad data into sense data registers 40. Step 710 includes sensing data in memory cells on at least one word line, in one embodiment. With reference to the example above with respect to FIG. 4B, the memory die 108 senses memory cells on one word line of Block 8, and stores the data in Sense Data Registers 40a. Also, the memory die 108 senses memory cells on one word line of Block 10, and stores the data in Sense Data Registers 40b. Note that step 710 could include the memory die 108 sensing memory cells in just one plane, two planes, four planes, etc. Also note that in some circumstances, step 710 could involve multiple memory dies sensing memory cells to obtain pad data.

Step 710 may include a sensing phase in which one or more read reference voltages are applied to a selected word line in a selected block. The data might be stored in the memory cells at one bit per cell, two bits per cell, three bits per cell, etc. The number of read reference voltages depends on the number of bits per cell, in one embodiment. As noted in the discussion of the example sense amplifier of FIG. 3B, data may first be stored in a Bitline Latch (e.g., BLL0-BLL3), and then into one or more of the latches 194. Typically, only one of the LDL 151, MDL 152, and UDL 153 are used for SLC data, two are used when sensing two bits per cell, and three are used when three bits are sensed per cell.

Step 712 includes the memory die 108 transferring the sensed data from the sense data registers 40 to I/O data registers 42. With reference to FIG. 4B, the data in Sense Data Registers 40a is transferred to I/O Data Registers 42a, the data in Sense Data Registers 40b is transferred to I/O Data Registers 42b. With reference to FIG. 3B, the data is transferred from latches 194 to I/O interface 198.

Step 714 includes transferring the data from the I/O registers 42 to the data buffer 34. With reference to FIG. 1A, the data is transferred from I/O Data Registers 42 to data buffer 34. With reference to FIG. 5, a complete fragment has now been formed in the data buffer 34. That is, whatever pad data was needed for the fragment, has been transferred to the data buffer 34. Also, the sector data for the fragment has been received by the data buffer 34.

Figure 8:
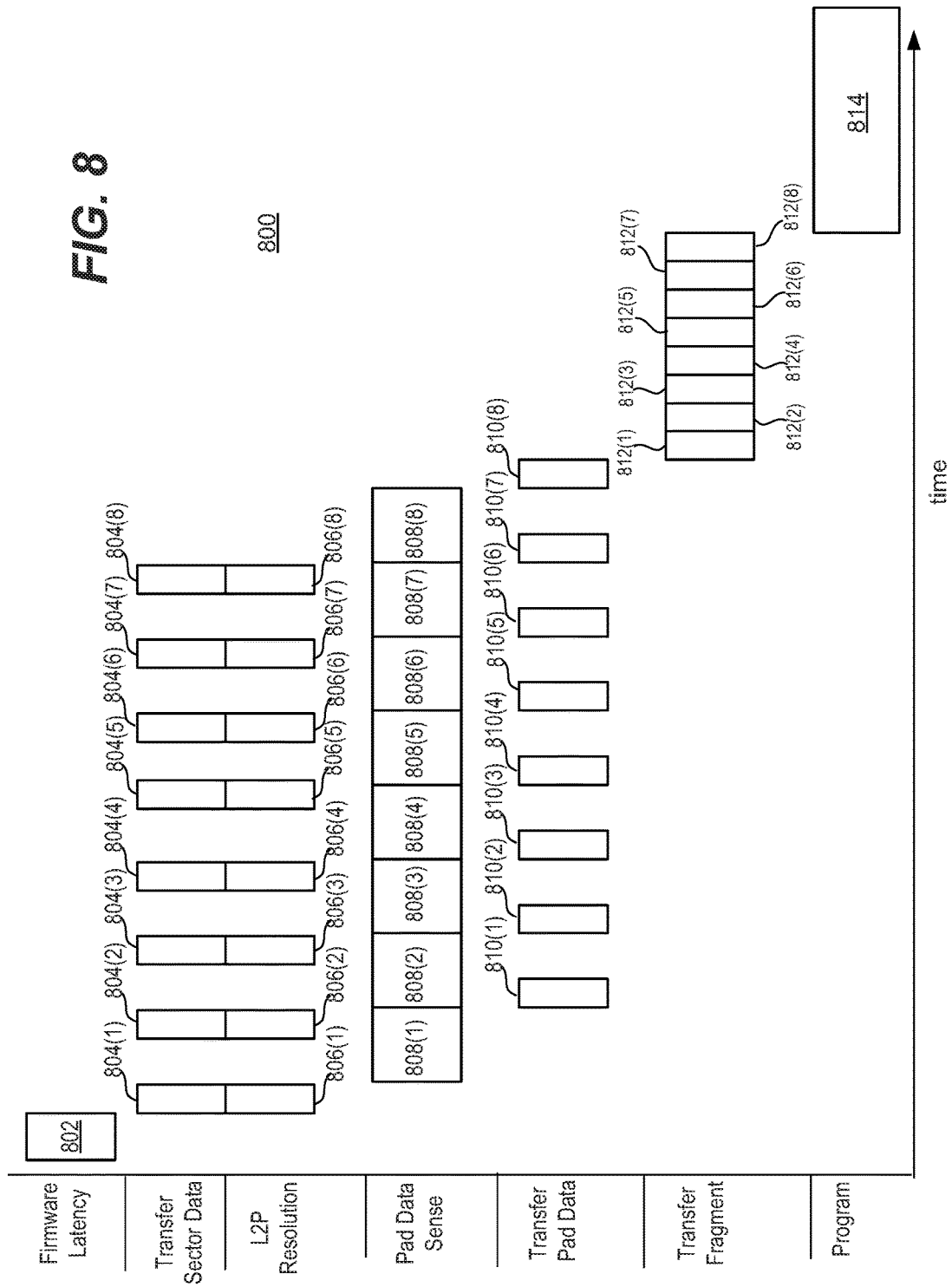
FIG. 8 is a diagram that illustrates timing in one embodiment of programming data for multiple unaligned write commands.

FIG. 8 is a diagram that illustrates timing in one embodiment of programming data for multiple unaligned write commands. The timing diagram has an axis labeled "time," and illustrates a sequence of operations performed by a memory system 100. The timing diagram is divided into phases: 1) Firmware Latency; 2) Transfer Sector Data; 3) L2P Resolution; 4) Pad Data Sense; 5) Transfer Pad Data; 6) Transfer Fragment; and 7) Program. In this example, eight unaligned write commands are processed. The aligned data for all eight unaligned write commands are concurrently programmed, in this example. Stated another way, the complete fragments for each of the eight unaligned write commands are concurrently programmed, in this example.

Initially, there is some firmware latency, as indicated by firmware operation 802. This firmware operation 802 includes the memory controller 122 identifying unaligned write commands in the command queue 32. This firmware operation 802 represents one embodiment of step 602. This firmware latency 802 represents one embodiment of step 702.

Next, the transfer sector data phase and the L2P resolution phase begin for a first of the unaligned write commands. This is indicated by transfer sector data 804(1) and L2P resolution 806(1). Note that transfer sector data 804(1) corresponds to step 706 of process 700, and L2P resolution 806(1) corresponds to step 704 of process 700.

Next, the pad data sense phase begins for the first unaligned write command. This is indicated by pad data sense 808(1). The pad data sense corresponds to steps 708, 710, and 712 of process 700.

Note that the transfer sector data phase and the L2P resolution phase for the second unaligned write command may begin during the pad data sense phase of the first unaligned write command. For example, after the memory controller 122 sends the read command to the memory die in step 708 of process 700, the memory controller 122 may perform steps 704 and 706 for the second unaligned write command. This is represented in the timing diagram 800 in FIG. 8 by transfer sector data 804(2) and L2P resolution 806(2).

After the pad data sense phase is over for the first unaligned write command, the pad data sense phase may begin for the second unaligned write command. This is represented by pad data sense 808(2) in the timing diagram 800. Moreover, the transfer pad data phase for the first unaligned write command may be consolidated with the pad data sense phase for the second unaligned write command. This is represented in the timing diagram by transfer pad data 810(1) occurring at the same time as at least a portion of pad data sense 808(2). In this example, the transfer pad data phase is shorter than the pad data sense phase.

Thus note that the timing diagram 800 shows the consolidating of sensing of pad data from memory cells on a memory die for one of the unaligned write commands (e.g., second unaligned write command) with transferring data previously sensed from memory cells on the memory die to the data buffer for another of the unaligned write commands (e.g., first unaligned write command). This consolidating may be performed for other pairs of unaligned write commands. For example, the pad data sense phase 808(3) is consolidated with transfer pad data phase 810(2), etc.

The timing diagram 800 also shows how the transfer sector data phase, L2P resolution phase, pad data sense phase, and transfer pad data phase continues in a similar manner for other pairs of unaligned write commands. Eventually, the data buffer 34 will contain a complete fragment for all eight unaligned commands. Stated another way, the data buffer 34 will contain aligned data for all eight unaligned commands. In other words, any needed pad data (pre-pad and/or post pad) for all eight unaligned commands is transferred to the data buffer by operations 810(1) to 810(8). Also, the sector data for all eight unaligned commands is transferred to the data buffer by operations 804(1) to 804(8). Note that in this example the transferring of sector data to the data buffer 34 does not occur while transferring the pad data to the data buffer 34.

In one embodiment, the memory controller 122 processes a sufficient number of unaligned write commands such that the number of fragments correspond to a maximum unit of programming. For example, maximum unit of programming might be eight ECC pages in a block in Plane 0, and another eight ECC pages in a block in Plane 1, if programming a single bit per memory cell. Thus, the maximum unit of programming in this SLC example is 16 ECC pages. To further expand on this example, a fragment might be two ECC pages. Thus, a maximum unit of programming is eight fragments in this example. There could be more or fewer than eight fragments in a maximum unit of programming.

After the data buffer 34 has been filled with all of the data for all of the eight unaligned write commands, the transfer fragment phase begins. This is represented by the transfer of eight fragments 812(1)-812(8) to the memory die. The transferring of the eight fragments 812(1)-812(8) corresponds to one embodiment of step 608 of process 600. With reference to FIG. 1A, the eight fragments 812(1)-812(8) are transferred from the data buffer 34 to the I/O data registers 42.

Next, the eight fragments 812(1)-812(8) are programmed during the program phase 814. This corresponds to one embodiment of step 610 of process 600. The data could be programmed to one bit per memory cell, two bits per memory cell, three bits per memory cell, etc. The fragments could be programmed into memory cells in one or more planes. For example, with reference to FIG. 4B, the data in I/O registers 42*a* is transferred to sense data registers 40*a*, and the data in I/O registers 42*b* is transferred to sense data registers 40*b*. Note that in this context, sense data registers 40*b* may include one or more of the LDL 151, MDL 152, and UDL 153 latches 194 depicted in FIG. 3B. The data in the sense data registers 40*a* might be programmed into memory cells on a selected word line in Block 8 of Plane 0, for example. The data in the sense data registers 40*b* might be programmed into memory cells on a selected word line in Block 10 of Plane 1, for example. Note that the programming may be to a maximum unit of programming. As noted, the term "maximum unit of programming" refers to the maximum amount of data that can be concurrently programmed into memory cells on a memory die (which depends on the number of bits programmed per memory cell).

The following examples will show how the sequence in the timing diagram 800 can save consideration time. The following assumptions are made. The time for transfer sector data 804 for a single command is 50 microseconds (this is also the worst case L2P resolution 806), the pad data sense time is 80 microseconds, the time to transfer each pad data to the data buffer is 30 microseconds the time to transfer each fragment from the data buffer to the memory die is 30 microseconds, and the programming time is 300 microseconds.

The total time in FIG. 8 is one transfer of sector data 804(1), eight sense operations 808(1)-808(8), one transfer of pad data 810(8), eight transfers of fragments 812(1)-812(8), and one programming operation 814. This is 30+8*(80+30)+ 30+300=1240 microseconds (not counting the initial firmware latency 802).

Note that the timing 800 in FIG. 8 hides the transferring of pad data 810(1)-810(7) within a sensing operation of pad data for another unaligned write command, which saves time. Note that "n−1" pairs of unaligned write command out of "n" unaligned write command are consolidated in this manner. Also, note that the timing 800 in FIG. 8 concurrently programs the fragments for all "n" unaligned write commands. Note that the fragments are the maximum unit of programming in one embodiment. Hence, substantial time is saved.

In contrast, a more naïve technique that needs to perform a read-write-modify for each unaligned write command is much more time consuming. Such a technique might use eight transfers of sector data 804, eight sense operations 808, eight transfers of pad data 810, eight transfers of fragments 812, and eight programming operations 814. This is 8*(50+ 80+30+30+300)=3920 microseconds (not counting the initial firmware latency 802).

Figure 9:
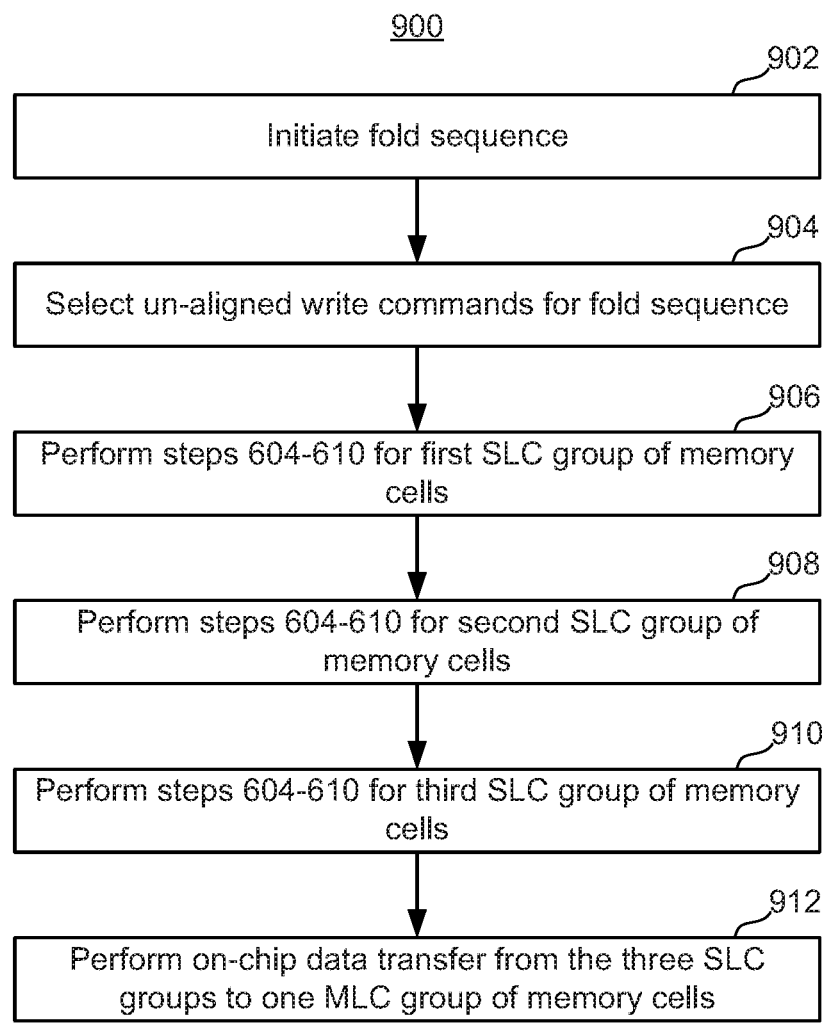
FIG. 9 is a flowchart of one embodiment of a process of handling of unaligned write commands is performed during a folding from SLC memory cells to MLC memory cells.

In one embodiment, processing of unaligned write commands is performed during a folding from SLC memory cells to MLC memory cells. FIG. 9 is a flowchart of one embodiment of a process 900 of handling of unaligned write commands during a folding from SLC memory cells to MLC memory cells. The process 900 could be performed in a memory system 100 such as the memory systems in FIG. 1A, 1B, 1C, 2, or 3A. During process 900 a sense amplifier such as the sense amplifier of FIG. 3B may be used. In process 900, the MLC cells are programmed to three bits per cell; however, the process 900 can be modified to program the MLC cells to two bits per cell, four bits per cell, etc.

Step 902 includes initiating a fold sequence. This step may be initiated by the memory controller 122.

Step 904 includes the memory controller 122 selecting unaligned write commands for the fold sequence from the command queue 32. The memory controller 122 may select a sufficient number of write commands for three SLC word lines if the MLC word line is to store three bits per memory cell. Note that this refers to three SLC word lines in Plane 0 and three SLC word lines in Plane 1, in an embodiment in which Plane 0 and Plane 1 have concurrent processing. Likewise, there may be an MLC word line in Plane 0 and another MLC word line in Plane 1. Note that step 904 may include dividing the unaligned write commands into a set of unaligned write commands for each of a plurality of SLC groups of memory cells. An SLC group of memory cells may be a word line of memory cells in each of one or more planes. Step 904 is one embodiment of step 602 of process 600. For the sake of illustration, the memory controller selects 24 unaligned write commands. This is consistent with the example of FIG. 8, in which there are eight fragments in a maximum unit of write.

Step 906 is to perform steps 604, 606, 608, and 610 of process 600 for a first SLC group. The first SLC group may include memory cells on a word line in each of one or more planes on a memory die. Performing step 906 once may result in a sequence of operations as depicted in FIG. 8. Thus, step 906 is performed for eight of the unaligned write commands, in the present example. The programming phase 814 results in all of the data for the eight unaligned write commands being programming concurrently, in one embodiment. Note that this may include programming memory cells on one or more planes. For example, word line 12 in Block 8 of Plane 0 is programmed to one bit per memory cell, while concurrently word line 12 in Block 10 of Plane 1 is programmed to one bit per memory cell.

Step 908 is to perform steps 604, 606, 608, and 610 of process 600 for a second SLC group. The second SLC group may include memory cells on a word line in each of one or more planes on a memory die. Performing step 908 once may result in a sequence of operations as depicted in FIG. 8. Thus, step 908 is performed for eight of the unaligned write commands, in the present example. The programming phase 814 results in all of the data for the eight unaligned write commands being programming concurrently, in one embodiment. Note that this may include programming memory cells on one or more planes. For example, word line 13 in Block 8 of Plane 0 is programmed to one bit per memory cell, while concurrently word line 13 in Block 10 of Plane 1 is programmed to one bit per memory cell.

Step 910 is to perform steps 604, 606, 608, and 610 of process 600 for a third SLC group. The third SLC group may include memory cells on a word line in each of one or more planes on a memory die. Performing step 910 once may result in a sequence of operations as depicted in FIG. 8. Thus, step 910 is performed for eight of the unaligned write commands, in the present example. The programming phase 814 results in all of the data for the eight unaligned write commands being programming concurrently, in one embodiment. Note that this may include programming memory cells on one or more planes. For example, word line 14 in Block 8 of Plane 0 is programmed to one bit per memory cell, while concurrently word line 4 in Block 10 of Plane 1 is programmed to one bit per memory cell.

Step 912 includes performing an on-chip data transfer of the data just programmed to the three SLC groups to one MLC group. The MLC group may include memory cells on a word line in each of one or more planes on a memory die. In the present example, the data from word lines 12, 13, and 14 in Block 8 of Plane 0 may be programmed to three bits per memory cell in Block 1012 of Plane 0, while at the same time the data from word lines 12, 13, and 14 in Block 10 of Plane 1 may be programmed to three bits per memory cell in Block 1014 of Plane 1. The on-chip data transfer may include sensing of data from the SLC word lines into registers such as the sense data registers 40, and then programming into the MLC word line without ever transferring the data off from the memory die 108.

A first embodiment disclosed herein is an apparatus comprising: a memory die having memory cells; a data buffer; and one or more control circuits. The one or more control circuits are configured to: receive unaligned data into the data buffer. The unaligned data is for a plurality of unaligned write commands. The one or more control circuits are configured to concurrently sense pad data from memory cells on the memory die for one of the unaligned write commands and transfer pad data previously sensed from memory cells on the memory die to the data buffer for another of the unaligned write commands. The one or more control circuits are configured to transfer aligned data for each of the unaligned write commands from the data buffer to the memory die. The one or more control circuits are configured to program the aligned data into a group of memory cells on the memory die.

In a second embodiment, and in furtherance of the first embodiment, the one or more control circuits are further configured to concurrently program all of the aligned data into the group of memory cells on the memory die.

In a third embodiment, and in furtherance of the first or second embodiments, the one or more control circuits are further configured to concurrently sense pad data from memory cells on the memory die for one of the unaligned write commands and transfer pad data previously sensed from memory cells on the memory die to the data buffer for another of the unaligned write commands for "n−1" pairs of "n" unaligned write commands.

In a fourth embodiment, and in furtherance of any of the first to third embodiments, the memory die comprises a first set of data registers and a second set of data registers. To concurrently sense pad data from memory cells on the memory die for one of the unaligned write commands and transfer pad data previously sensed from memory cells on the memory die to the data buffer for another of the unaligned write commands the one or more control circuits are further configured to: sense a first set of memory cells on the memory die in order to store pad data for a first of the unaligned write commands into the first set of data registers; transfer the pad data for the first unaligned write command from the first set of data registers to the second set of data registers; and concurrently sense a second set of memory cells on the memory die in order to store pad data for a second of the unaligned write commands into the first set of data registers and transfer the pad data for the first unaligned write command from the second set of data registers to the data buffer.

In a fifth embodiment, and in furtherance of any the fourth embodiment, the one or more control circuits are further configured to concurrently program all of the aligned data for each of the unaligned write commands from the first set of data registers into the group of memory cells.

In a sixth embodiment, and in furtherance of any of the first to fifth embodiments, the group of memory cells are one complete maximum unit of programming.

In a seventh embodiment, and in furtherance of any of the first to sixth embodiments, the one or more control circuits are further configured to identify a sufficient number of unaligned write commands in a command queue such that the aligned data is one maximum unit of programming.

In an eighth embodiment, and in furtherance of any of the first to seventh embodiments, the group of memory cells reside on a plurality of planes in the memory die.

In a ninth embodiment, and in furtherance of any of the first to eighth embodiments, wherein the one or more control circuits are further configured to: select a sufficient number of unaligned write commands for a single level cell (SLC) to multi-level cell (MLC) fold operation; divide the unaligned write commands into a set for each of a plurality of SLC groups of memory cells; for each of the set of unaligned write commands: i) receive the unaligned data to the data buffer, ii) concurrently sense the pad data from memory cells on the memory die for one of the unaligned write commands in the set and transfer pad data previously sensed from memory cells on the memory die to the data buffer for another of the unaligned write commands in the set; iii) transfer aligned data for each of the unaligned write commands in the set from the data buffer to the memory die; and iv) program the aligned data for the set into a group of SLC memory cells on the memory die; and transfer the data from the plurality of SLC groups of memory cells into an MLC group of memory cells on the memory die/

One embodiment includes a method of operating a memory system. The method comprises identifying a plurality of unaligned write commands in a command queue of a memory controller; transferring unaligned data for the plurality of unaligned write commands to a data buffer of the memory controller; consolidating sensing of pad data from memory cells on a memory die for one of the unaligned write commands with transferring pad data previously sensed from memory cells on the memory die to the data buffer for another of the unaligned write commands. The transferring unaligned data and the transferring pad data previously sensed forms a complete fragment in the data buffer for each unaligned write commands. The method further comprises transferring a complete fragment of data for each of the unaligned write commands from the data buffer to the memory die; and programming the complete fragments of data that were transferred to the memory die into a group of memory cells on the memory die.

One embodiment includes a non-volatile memory system comprising: a memory die having memory cells; a data buffer; unaligned write command identification means for identifying a plurality of unaligned write commands in a command queue of a memory controller; first data transfer means for transferring unaligned data for the plurality of unaligned write commands to a data buffer of the memory controller; consolidating means for consolidating sensing of pad data from memory cells on a memory die for one of the unaligned write commands with transferring pad data previously sensed from memory cells on the memory die to the data buffer for another of the unaligned write commands; second data means for transferring a complete fragment of data for each of the unaligned write commands from the data buffer to the memory die; and programming means for programming the complete fragment of data that was transferred to the memory die into a group of memory cells on the memory die.

In one embodiment the first data transfer means comprises one or more of processor 122c, controller 122, RAM 122b, front end module 208, host interface 220, PHY 222, an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, the first data transfer means may include software stored in a processor readable device (e.g., memory) to program processor 122c to perform identifying a plurality of unaligned write commands in a command queue 32 of a memory controller 122.

In one embodiment the consolidating means comprises one or more of processor 122c, controller 122, RAM 122b, sense data registers 40, I/O data registers 42, sense block SB, read/write circuits 128, state machine 112, on-chip address decoder 114, power control 116, decoders 124/132, interface 122d, latches 164, processor 192, I/O interface 198, bitline latches BLL0-BLL3, sense circuitry SC0-SC3, an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, the consolidating means may include software stored in a processor readable device (e.g., memory) to program a processor 122 to perform at least a portion of consolidating sensing of pad data from memory cells on a memory die for one of the unaligned write commands with transferring data previously sensed from memory cells on the memory die to the data buffer for another of the unaligned write commands.

In one embodiment the second data transfer means comprises one or more of processor 122c, controller 122, RAM 122b, I/O registers 42, interface 122d, memory interface 230, an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, the second data transfer means may include software stored in a processor readable device (e.g., memory) to program processor 122c to perform transferring a complete fragment of data for each of the unaligned write commands from the data buffer 34 to the memory die 108.

In one embodiment the programming means comprises one or more of processor 122c, controller 122, RAM 122b, sense data registers 40, sense block SB, read/write circuits 128, state machine 112, on-chip address decoder 114, power control 116, decoders 124/132, latches 164, processor 192, I/O interface 198, bitline latches BLL0-BLL3, sense circuitry SC0-SC3, an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, the programming means may include software stored in a processor readable device (e.g., memory) to program a processor to perform at least a portion of programming the complete fragment of data that was transferred to the memory die into a group of memory cells on the memory die.

For the purpose of this document, the terms "write" and "store" are often used interchangeably, as are the terms "writing" and "storing."

For the purpose of this document, the numeric terms first (i.e., $1^{st}$) and second (i.e., $2^{nd}$) may be used to generally specify an order of when commands (e.g., write commands) are received by a memory controller from a host, as well as to generally specify an order in which data (e.g., $1^{st}$ and $2^{nd}$ data) is to be stored in non-volatile memory. However, it is noted that the term first (i.e., Pt) should not be interpreted as implying that nothing else precedes it. For example, previous write commands may have been received before a $1^{st}$ write command was received. However, it may be implied that a $2^{nd}$ write command is received at a later point in time than when a $1^{st}$ write command was received, as there terms are being used herein. Similarly, it can be implied that the a $3^{rd}$ write command was received after the $2^{nd}$ write command.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the terms "based on" and "in dependence on" may be read as "based at least in part on."

While various embodiments of the present technology have been described above, it should be understood that they have been presented by way of example, and not limitation. It will be apparent to persons skilled in the relevant art that various changes in form and detail can be made therein without departing from the spirit and scope of the technology. For example, although a few variations have been described in detail above, other modifications or additions are possible. In particular, further features and/or variations may be provided in addition to those set forth herein. For example, the implementations described above may be directed to various combinations and sub-combinations of the disclosed features and/or combinations and sub-combinations of several further features disclosed above. In addition, the logic flow depicted in the accompanying figures and/or described herein do not require the particular order shown, or sequential order, to achieve desirable results. Other embodiments may be within the scope of the following claims.

Embodiments of the present technology have been described above with the aid of functional building blocks illustrating the performance of specified functions and relationships thereof. The boundaries of these functional building blocks have often been defined herein for the convenience of the description. Alternate boundaries can be defined so long as the specified functions and relationships thereof are appropriately performed. Any such alternate boundaries are thus within the scope and spirit of the claimed technology. One skilled in the art will recognize that these functional building blocks can be implemented by discrete components, application specific integrated circuits, processors executing appropriate software and the like or any combination thereof.

The breadth and scope of the present technology should not be limited by any of the above-described exemplary embodiments, but should be defined only in accordance with the following claims and their equivalents.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus comprising:
a memory die having memory cells;
a data buffer; and
one or more control circuits configured to:
receive unaligned data into the data buffer, the unaligned data for a plurality of unaligned write commands;
concurrently sense pad data from memory cells on the memory die for one of the unaligned write commands and transfer pad data previously sensed from memory cells on the memory die to the data buffer for another of the unaligned write commands;
transfer aligned data for each of the unaligned write commands from the data buffer to the memory die; and
program the aligned data into a group of memory cells on the memory die.

2. The apparatus of claim 1, wherein the one or more control circuits are further configured to:
concurrently program all of the aligned data into the group of memory cells on the memory die.

3. The apparatus of claim 1, wherein the one or more control circuits are further configured to:
concurrently sense pad data from memory cells on the memory die for one of the unaligned write commands and transfer pad data previously sensed from memory cells on the memory die to the data buffer for another of the unaligned write commands for "n–1" pairs of "n" unaligned write commands.

4. The apparatus of claim 1, wherein the memory die comprises a first set of data registers and a second set of data registers, wherein to concurrently sense pad data from memory cells on the memory die for one of the unaligned write commands and transfer pad data previously sensed from memory cells on the memory die to the data buffer for another of the unaligned write commands the one or more control circuits are further configured to:
sense a first set of memory cells on the memory die in order to store pad data for a first of the unaligned write commands into the first set of data registers;
transfer the pad data for the first unaligned write command from the first set of data registers to the second set of data registers; and concurrently sense a second set of memory cells on the memory die in order to store pad data for a second of the unaligned write commands into the first set of data registers and transfer the pad data for the first unaligned write command from the second set of data registers to the data buffer.

5. The apparatus of claim 4, wherein the one or more control circuits are further configured to:
concurrently program all of the aligned data for each of the unaligned write commands from the first set of data registers into the group of memory cells.

6. The apparatus of claim 1, wherein the one or more control circuits are further configured to:
program all of the aligned data for the plurality of unaligned write commands into the group of memory cells on the memory die in a single programming operation per plane.

7. The apparatus of claim 1, wherein the one or more control circuits are further configured to:
identify a sufficient number of unaligned write commands in a command queue such that the aligned data is one maximum unit of programming.

8. The apparatus of claim 7, wherein the group of memory cells reside on a plurality of planes in the memory die.

9. The apparatus of claim 1, wherein the one or more control circuits are further configured to:
select a sufficient number of unaligned write commands for a single level cell (SLC) to multi-level cell (MLC) fold operation;
divide the unaligned write commands into a set for each of a plurality of SLC groups of memory cells;
for each of the set of unaligned write commands: i) receive the unaligned data to the data buffer, ii) concurrently sense the pad data from memory cells on the memory die for one of the unaligned write commands in the set and transfer pad data previously sensed from memory cells on the memory die to the data buffer for another of the unaligned write commands in the set; iii) transfer aligned data for each of the unaligned write commands in the set from the data buffer to the memory die; and iv) program the aligned data for the set into a group of SLC memory cells on the memory die; and
transfer the data from the plurality of SLC groups of memory cells into an MLC group of memory cells on the memory die.

10. A method of operating a memory system, the method comprising:
identifying a plurality of unaligned write commands in a command queue of a memory controller;
transferring unaligned data for the plurality of unaligned write commands to a data buffer of the memory controller;
consolidating sensing of pad data from memory cells on a memory die for one of the unaligned write commands with transferring pad data previously sensed from memory cells on the memory die to the data buffer for another of the unaligned write commands, wherein transferring the unaligned data and transferring the pad data previously sensed forms a complete fragment in the data buffer for each unaligned write command;
transferring a complete fragment of data for each of the unaligned write commands from the data buffer to the memory die; and
programming the complete fragments of data that were transferred to the memory die into a group of memory cells on the memory die.

11. The method of claim 10, wherein programming the complete fragments of data that were transferred to the memory die into a group of memory cells on the memory die comprises:
concurrently programming all of the complete fragments of data that were transferred to the memory die into the group of memory cells on the memory die.

12. The method of claim 10, wherein consolidating the sensing of pad data from memory cells on the memory die for one of the unaligned write commands with the transferring previously sensed pad data from the memory die to the data buffer for another of the unaligned write commands is performed for "n−1" pairs of "n" unaligned write commands.

13. The method of claim 10, wherein consolidating the sensing of pad data from memory cells on the memory die for one of the unaligned write commands with the transferring previously sensed pad data from the memory die to the data buffer for another of the unaligned write commands comprises:
sensing a first set of memory cells on the memory die in order to store pad data for a first of the unaligned write commands into a first set of data latches;
transferring the pad data for the first unaligned write command from the first set of data latches to a second set of data latches; and
sensing a second set of memory cells on the memory die in order to store pad data for a second of the unaligned write commands into the first set of data latches while transferring the pad data for the first unaligned write command from the second set of data latches to the data buffer.

14. The method of claim 13, wherein programming the complete fragment of data that was transferred to the memory die into a group of memory cells on the memory die comprises:
concurrently programming each of the complete fragments of data for each of the unaligned write commands from the first set of data latches into the group of memory cells.

15. The method of claim 10, wherein programming each of the complete fragments of data that were transferred to the memory die into a group of memory cells on the memory die comprises:
programming one maximum unit of programming in the memory die.

16. The method of claim 10, wherein identifying the plurality of unaligned write commands comprises identifying random write commands.

17. A non-volatile memory system comprising:
a memory die having memory cells;
a data buffer;
unaligned write command identification means for identifying a plurality of unaligned write commands in a command queue of a memory controller;
first data transfer means for transferring unaligned data for the plurality of unaligned write commands to a data buffer of the memory controller;
consolidating means for consolidating sensing of pad data from memory cells on a memory die for one of the unaligned write commands with transferring pad data previously sensed from memory cells on the memory die to the data buffer for another of the unaligned write commands;
second data means for transferring a complete fragment of data for each of the unaligned write commands from the data buffer to the memory die; and programming means for programming the complete fragment of data that was transferred to the memory die into a group of memory cells on the memory die.

18. The non-volatile memory system of claim 17, wherein the programming means is further for concurrently programming the complete fragment of data that was transferred to the memory die into the group of memory cells on the memory die.

19. The non-volatile memory system of claim 17, wherein the consolidating means is further for consolidating the sensing of pad data from memory cells on the memory die for one of the unaligned write commands with the transferring previously sensed pad data from the memory die to the data buffer for another of the unaligned write commands is performed for "n−1" pairs of "n" unaligned write commands.

20. The non-volatile memory system of claim 17, wherein:
- the unaligned write command identification means is further for identifying a sufficient number of unaligned write commands in the command queue such that the complete fragments of data are one maximum unit of programming; and
- the programming means is further for programming all of the complete fragments in order to program the maximum unit of programming.

\* \* \* \* \*